(12) United States Patent
Nagasawa et al.

(10) Patent No.: US 7,838,402 B2
(45) Date of Patent: Nov. 23, 2010

(54) METHOD OF MANUFACTURING ELECTRONIC APPARATUS AND ELECTRONIC APPARATUS

(75) Inventors: Koichi Nagasawa, Aichi (JP); Takashi Yamaguchi, Aichi (JP); Nobutaka Ozaki, Aichi (JP); Yasuhiro Kanaya, Tokyo (JP); Hirohisa Takeda, Aichi (JP); Yasuo Mikami, Aichi (JP); Yoshifumi Mutoh, Aichi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/275,448

(22) Filed: Nov. 21, 2008

(65) Prior Publication Data

US 2009/0134461 A1 May 28, 2009

(30) Foreign Application Priority Data

Nov. 26, 2007 (JP) ............................. 2007-304357

(51) Int. Cl.
*H01L 21/26* (2006.01)
*H01L 21/42* (2006.01)

(52) U.S. Cl. ....................... 438/535; 438/149; 438/463; 438/513; 257/E21.051; 257/E21.077; 257/E21.058; 257/E21.134; 257/E21.189; 257/E21.231; 257/E21.311; 257/E21.329; 257/E21.411; 257/E21.632

(58) Field of Classification Search ................... 438/30, 438/57, 149, 197, 199, 463, 509, 513, 535; 257/E21.051, E21.077, E21.058, E21.134, 257/E21.189, E21.231, E21.311, E21.329, 257/E21.411, E21.632
See application file for complete search history.

(56) References Cited

U.S. PATENT DOCUMENTS

| 5,645,766 | A | * | 7/1997 | Shiro et al. | ................. | 252/582 |
| 6,254,715 | B1 | * | 7/2001 | Okazaki et al. | ............. | 156/280 |
| 6,368,681 | B1 | * | 4/2002 | Ogawa | ...................... | 428/1.23 |
| 6,797,129 | B2 | * | 9/2004 | Raychaudhuri et al. | | 204/192.15 |

FOREIGN PATENT DOCUMENTS

| JP | 5-26189 | 2/1993 |
| JP | 2002-3356115 | 10/2002 |
| JP | 2004-309955 | 11/2004 |
| JP | 2005-3642048 | 2/2005 |

* cited by examiner

*Primary Examiner*—David Nhu
(74) *Attorney, Agent, or Firm*—SNR Denton US LLP

(57) ABSTRACT

A method of manufacturing an electronic apparatus having a resist pattern provided over a substrate provided with a thin film transistor, the method includes the steps of forming by application a resist film over the substrate in the state of covering the thin film transistor, forming a resist pattern by subjecting the resist film to exposure to light and a developing treatment, and irradiating the resist pattern with at least one of ultraviolet light and visible light in a dry atmosphere in the condition where a channel part of the thin film transistor is prevented from being irradiated with light having a wavelength of shorter than 260 nm, wherein a step of heat curing the resist pattern is conducted after the irradiation with at least one of ultraviolet light and visible light.

13 Claims, 22 Drawing Sheets

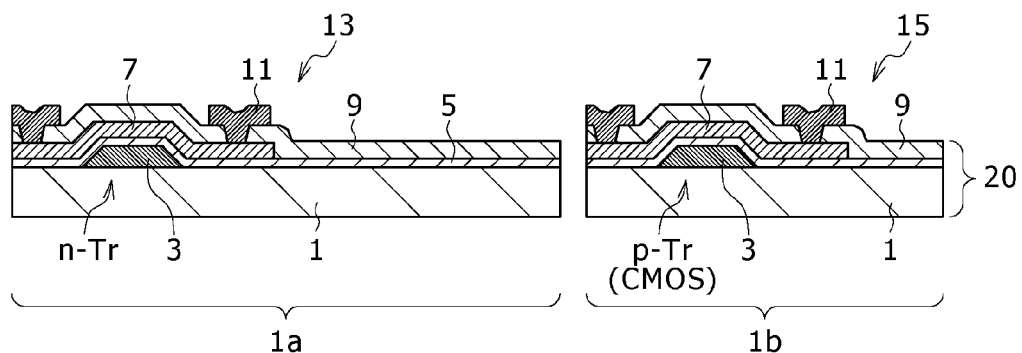
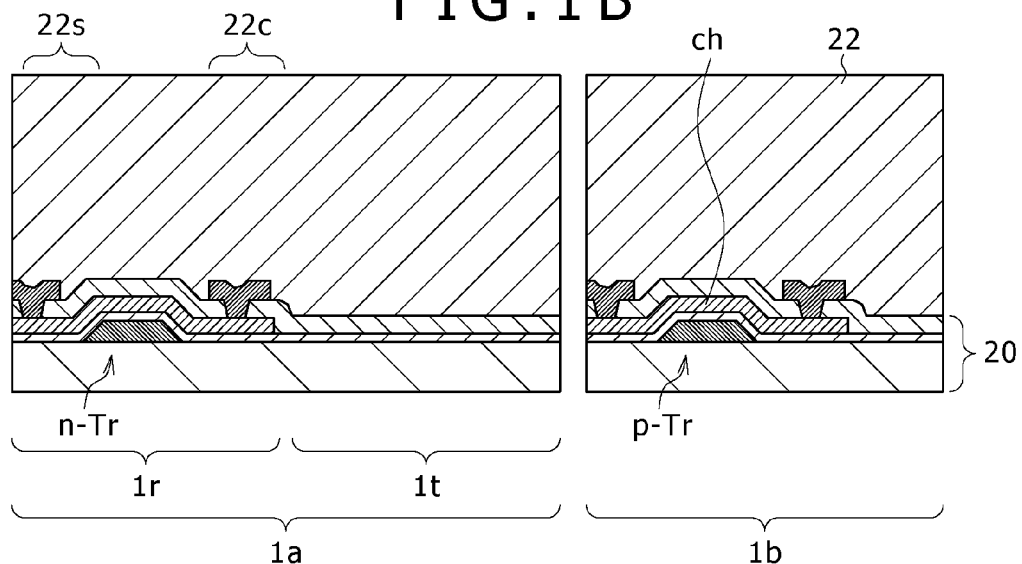
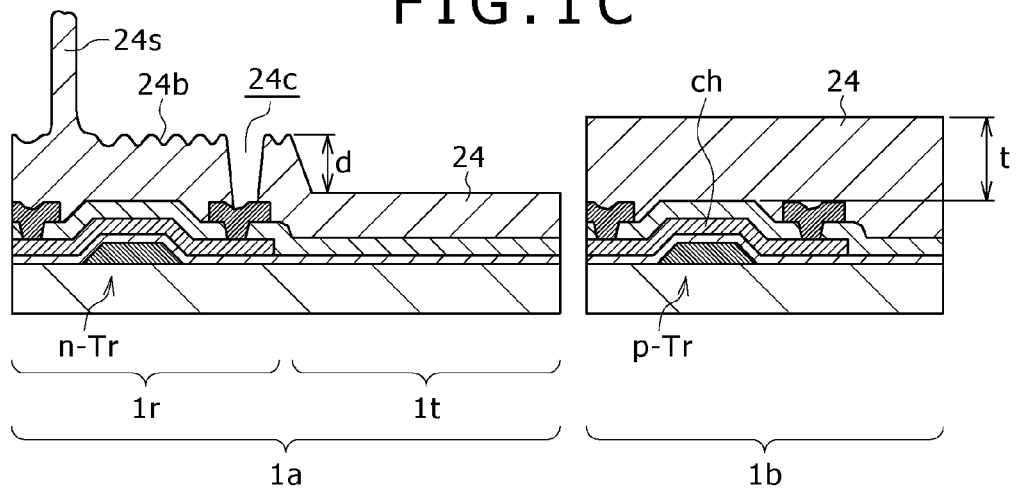

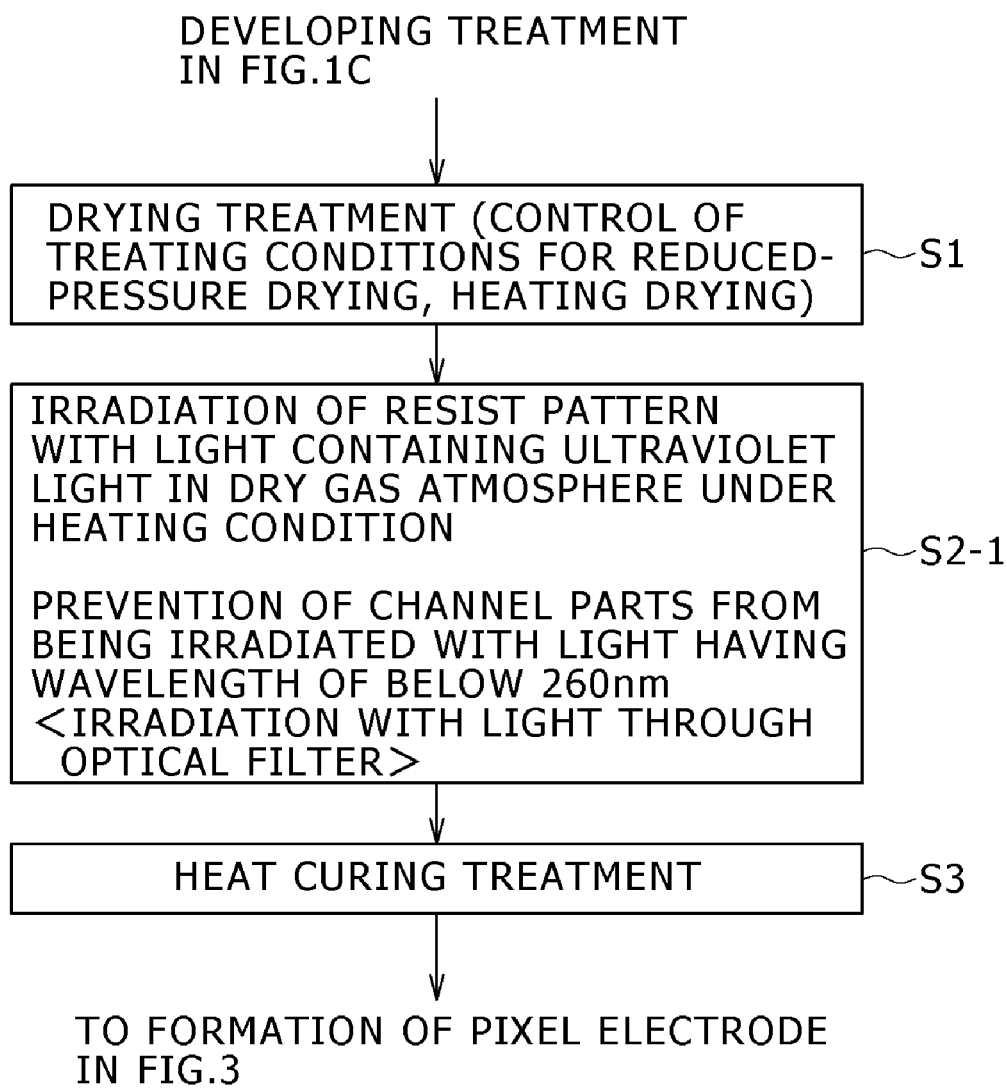

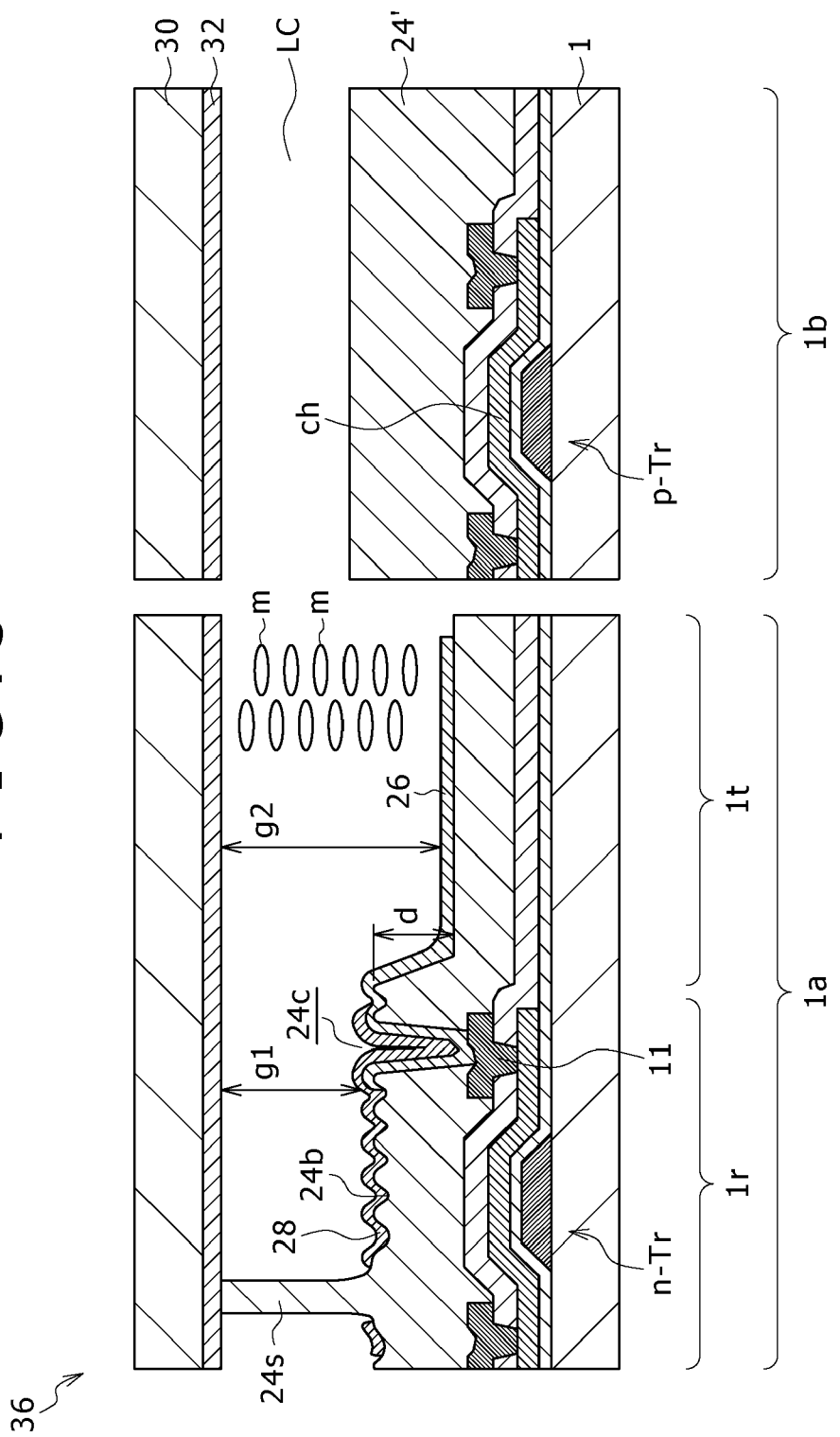

IMMEDIATELY UPON DEVELOPMENT

LIGHT IRRADIATION: HIGH PRESSURE MERCURY LAMP + OPTICAL FILTER DRY GAS ATMOSPHERE

HEAT CURING TREATMENT: 220°C

<FIRST EMBODIMENT APPLIED>

LIGHT IRRADIATION: EXTRA-HIGH PRESSURE MERCURY LAMP

HEAT CURING TREATMENT: 220°C

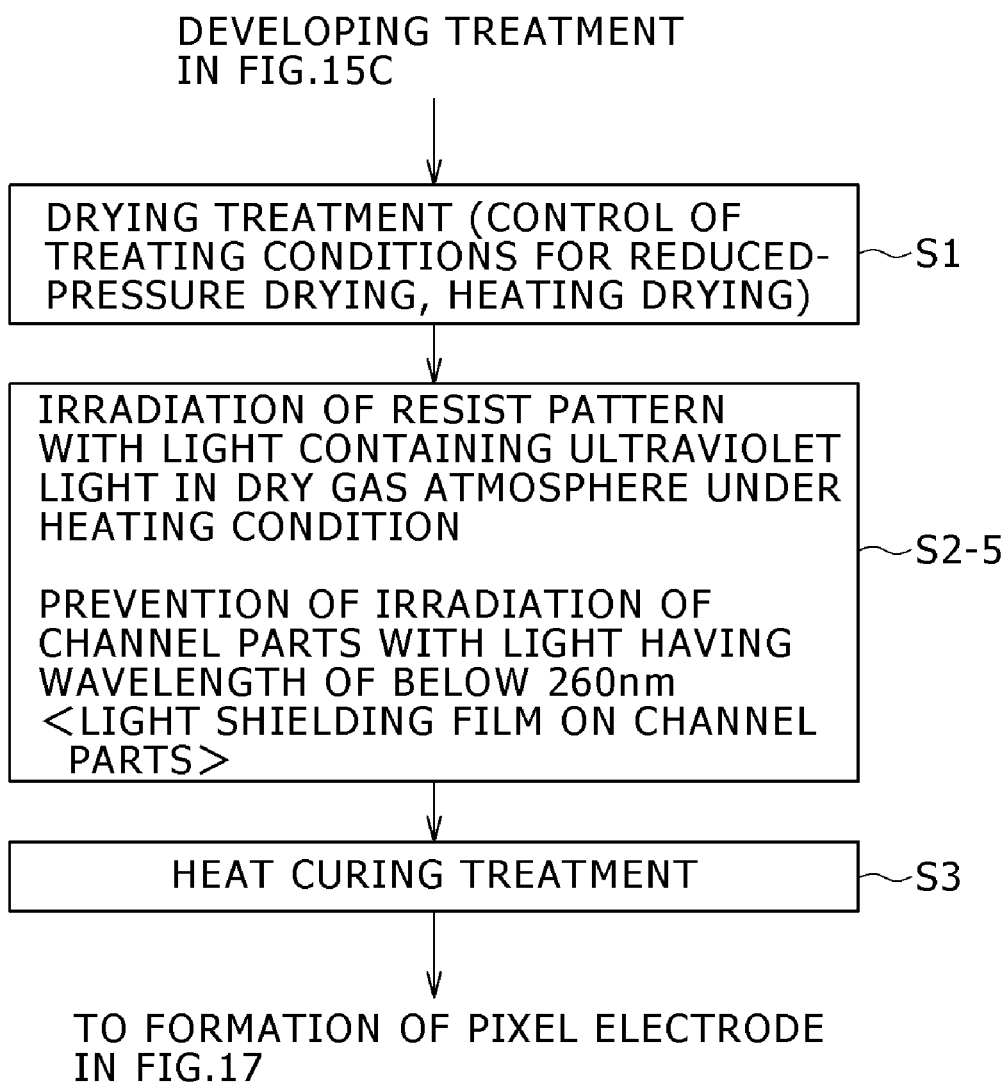

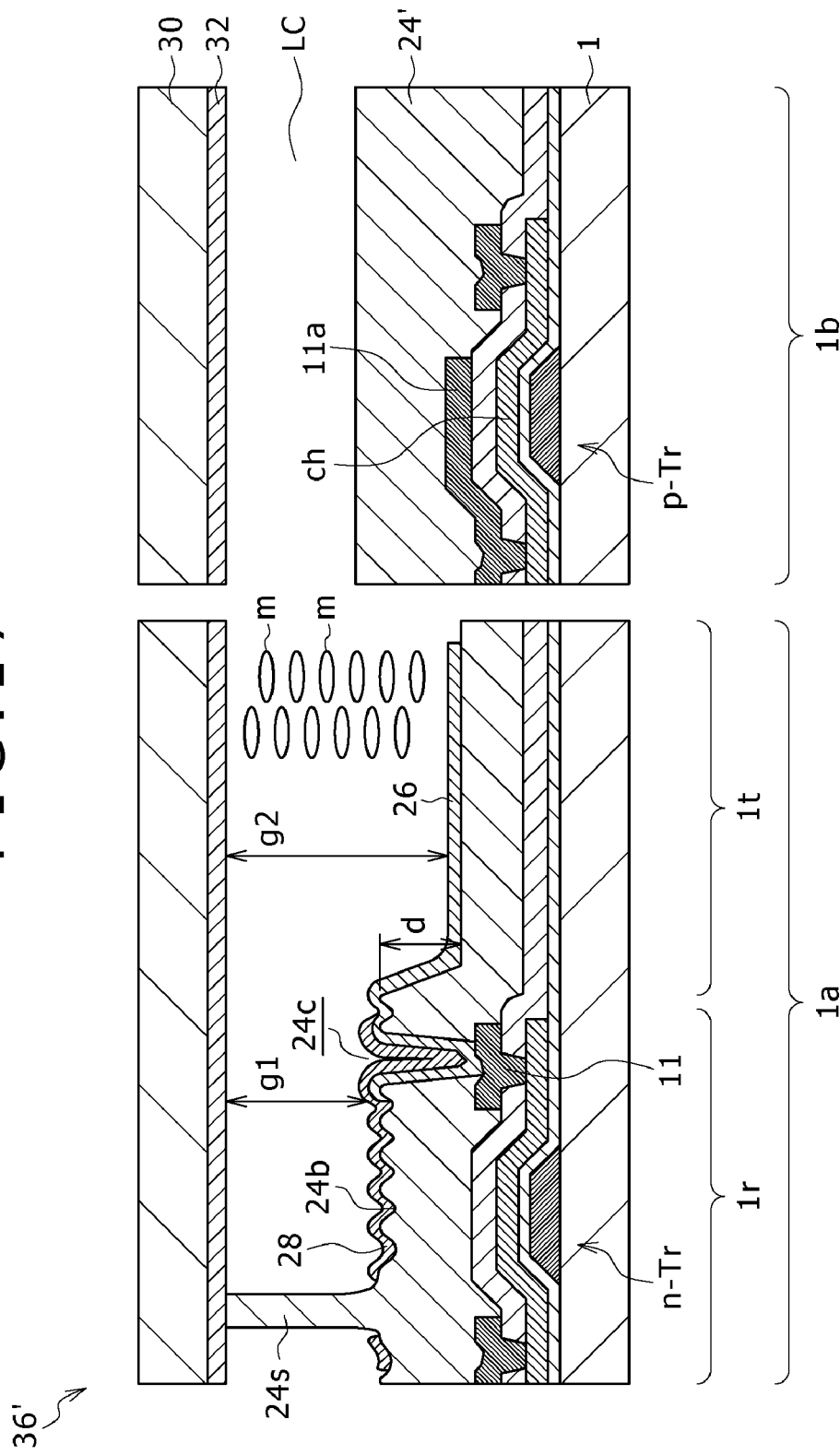

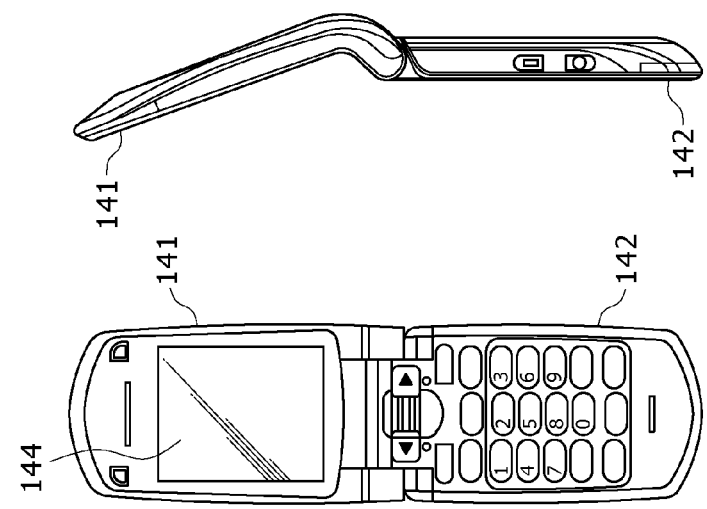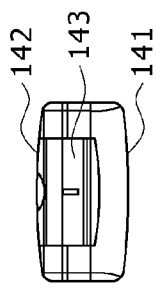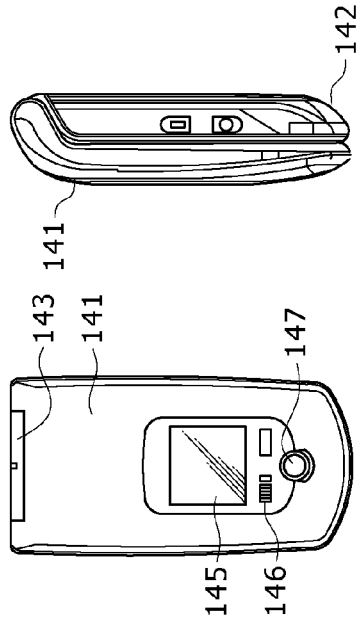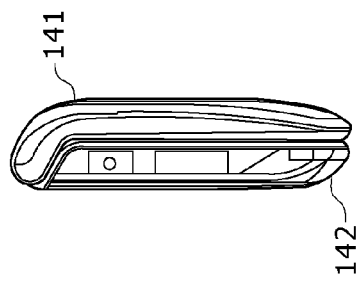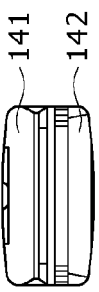

METHOD OF MANUFACTURING ELECTRONIC APPARATUS AND ELECTRONIC APPARATUS

CROSS REFERENCES TO RELATED APPLICATIONS

The present invention contains subject matter related to Japanese Patent Application JP 2007-304357 filed in the Japan Patent Office on Nov. 26, 2007, the entire contents of which being incorporated herein by reference.

BACKGROUND OF THE INVENTION

1. Field of the Invention

The present invention relates to a method of manufacturing an electronic apparatus, and an electronic apparatus. More particularly, the invention relates to a method of manufacturing an electronic apparatus, and an electronic apparatus, in which a resist pattern is provided as an insulating film over a substrate provided with thin film transistors, such as a display device.

2. Description of the Related Art

In a thin type electronic apparatus such as a liquid crystal display device, for example, an electronic circuit such as a pixel circuit and a driving circuit which uses a plurality of thin film transistors is provided on a substrate. In such an electronic apparatus, a resist pattern is used as an inter-layer insulating film covering the thin film transistors. In a liquid crystal display device, for example, a positive-type resist material containing a highly transparent acrylic polymer as a base resin and a diazo compound as a photosensitive agent is used.

The resist pattern is formed as follows. First, an uncured resist film is formed on a substrate by application, and the uncured resist film is subjected to an exposing and developing treatment to form a resist pattern. Thereafter, further, the resist pattern is heat cured. In the heat curing, for example, in the case of the above-mentioned positive-type resist containing a diazo compound as a photosensitive agent, irradiation with ultraviolet light having a wavelength of up to 320 nm leads to a remarkable shortening of the treating time (refer to Japanese Patent Publication No. Hei 5-26189).

In addition, as a means for enhancing the heat resistant of the resist film after heating curing, for example, a method in which irradiation with light containing ultraviolet rays is conducted at the time of heat curing has been proposed (refer to Japanese Patent No. 3356115). Further, a method in which irradiation with a high energy radiation is conducted under a reduced pressure and then heat curing is conducted has been proposed. It is said that, according to this procedure, a cross-linking reaction proceeds while conversion of the diazo compound as the photosensitive agent into a carboxylic acid is prevented, so that a resist pattern which is dense and shows enhanced heat resistance and chemical resistance is obtained (refer to Japanese Patent Laid-open No. 2004-309955).

SUMMARY OF THE INVENTION

It has been found, however, that in the above-mentioned manufacturing method, irradiation of channel parts of the thin film transistors with ultraviolet light during the curing treatment of the resist pattern causes degradation of characteristics of the thin film transistors, particularly, p-channel type thin film transistors, as shown in FIG. 25. Besides, as shown in FIG. 26, the degradation of characteristics of the thin film transistors becomes heavier as the irradiation energy is higher, as compared with the characteristics obtained without irradiation with ultraviolet light.

Thus, there is a need for a method of manufacturing an electronic apparatus, and an electronic apparatus, in which a resist pattern can be cured while maintaining its shape immediately upon lithography, without degrading the characteristics of thin film transistors covered with the resist pattern.

In accordance with one embodiment of the present invention, there is provided a method of manufacturing an electronic apparatus having a resist pattern provided over a substrate provided with thin film transistors, the method being carried out as follows. First, a resist film is formed by application over the substrate in the condition of covering the thin film transistors. Next, the resist film is subjected to exposing and developing treatments, thereby forming the resist pattern. Thereafter, the substrate provided with the resist pattern is subjected to a drying treatment. Subsequently, the resist pattern having undergone the drying treatment is irradiated with at least one of ultraviolet light and visible light in a dry atmosphere. In this instance, the irradiation with light is conducted in the condition where channel parts of the thin film transistors are prevented from being irradiated with light having a wavelength of shorter than 260 nm. Thereafter, the resist pattern is heat cured.

In the method as above-mentioned, before the step of heat curing the resist pattern patterned through the exposure and development, a step of irradiating with at least one of ultraviolet light and visible light in an atmosphere filled with a dry gas is carried out. This ensures that reflow of the resist material during the subsequent heat curing is prevented, and the surface shape of the resist pattern is maintained in the shape as patterned through the exposure and development. Further, in the step of irradiating with at least one of ultraviolet light and visible light, the channel parts of the thin film transistors are prevented from being irradiated with light having a wavelength of shorter than 260 nm. Therefore, degradation of characteristics of the thin film transistors, particularly, degradation of characteristics of p-type thin film transistors p-Tr, can be prevented from occurring due to irradiation of the channel parts with short-wavelength light.

Besides, in accordance with another embodiment of the present invention, there is provided a configuration of an electronic apparatus suitable for the above-mentioned manufacturing method according to the one embodiment of the present invention. In the electronic apparatus, the thin film transistors are of a bottom gate type, and a light shielding film operative to cut off irradiation with light having a wavelength of shorter than 260 nm is provided at least over the channel parts of the thin film transistors of p-channel type.

According to the embodiments of the present invention as above-mentioned, it is possible to obtain a liquid crystal display device 36 having a highly heat-resistant resist pattern cured assuredly while maintaining its shape immediately upon lithography, without degradation of characteristics of thin film transistors covered with the resist pattern.

BRIEF DESCRIPTION OF THE DRAWINGS

FIGS. 1A to 1C are sectional step views for illustrating manufacturing methods according to first to fourth embodiments;

FIG. 2 is a flowchart illustrating a prime part of the manufacturing method according to the first embodiment;

FIG. 3 is an essential part sectional view of a liquid crystal display device obtained in the first to fourth embodiments;

FIG. 16 is a flowchart illustrating a prime part of the manufacturing method according to the fifth embodiment;

FIG. 17 is an essential part sectional view of a liquid crystal display device obtained in the fifth embodiment;

FIGS. 21A and 21B show a digital camera to which the present invention is applied, wherein FIG. 21A is a perspective view from the face side, and FIG. 21B is a perspective view from the back side;

FIGS. 24A to 24G show a PDA, for example, a mobile phone, to which the present invention is applied, wherein FIG. 24A is a front view of an opened state, FIG. 24B is a side view of the same, FIG. 24C is a front view of a closed state, FIG. 24D is a left side view, FIG. 24E is a right side view, FIG. 24F is a top view, and FIG. 24G is a bottom view;

DETAILED DESCRIPTION OF THE PREFERRED EMBODIMENTS

Figure 4R:
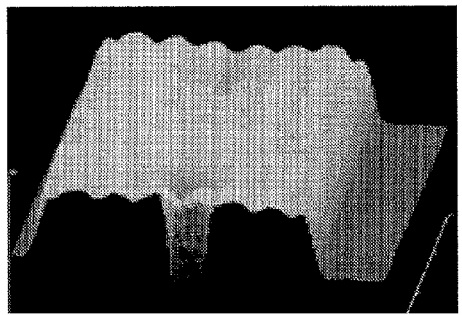
FIGS. 4R, 4A and 4B show surface conditions of resist patterns obtained according to the procedure and histories in the first embodiment.

Now, embodiments in which the present invention is applied to a method of manufacturing an active matrix driving type semi-transmitting semi-reflecting liquid crystal display device, as one of electronic apparatuses provided with thin film transistors, will be described below.

First Embodiment

FIGS. 1A to 1C are sectional step views illustrating the manufacturing method according to a first embodiment, showing a one-pixel portion of a display region 1a of the liquid crystal display device, and an essential part of a peripheral region 1b arranged in the periphery of the display region 1a.

First, as shown in FIG. 1A, bottom gate type thin film transistors Tr each having a gate electrode 3, a gate insulating film 5, and a semiconductor layer 7 laminated sequentially are formed on a transparent first substrate 1 made of a glass or the like. In this case, for example in the display region 1a, an n-channel type thin film transistor (n-type thin film transistor) n-Tr is formed correspondingly to each pixel. In the peripheral region 1b, on the other hand, an n-type thin film transistor n-Tr and a p-type thin film transistor p-Tr are formed. Incidentally, in the peripheral region 1b in the drawings, only the p-type thin film transistor p-Tr is shown.

Next, the first substrate 1 provided with the thin film transistors Tr is covered on the upper side with an inter-layer insulating film 9, and wirings 11 are formed which are connected to the thin film transistors Tr through contact holes formed in the inter-layer insulating film 9. As a result, each of pixels in the display region 1a is provided with a pixel circuit 13 using the thin film transistor Tr. In addition, in the peripheral region 1b, driving circuits 15 of a CMOS configuration using the n-type thin film transistor n-Tr and the p-type thin film transistor p-Tr are formed. Details of the pixel circuit 13 and the driving circuit 15 will be described later.

In the above-mentioned manner, a so-called TFT substrate 20 is formed. On the face side of the TFT substrate 20, a rugged shape (projection-and-recess shape) due to the thin film transistors Tr and the wirings 11 is generated.

Subsequently, as shown in FIG. 1B, an uncured resist film 22 is formed on the TFT substrate 20 by application (coating). Here, a positive-type resist containing a diazo compound as a photosensitive agent and at least one of an acrylic ester and a methacrylic ester as a base resin is used. Incidentally, as the resist material, for example, the resist materials exemplified in Japanese Patent No. 3642048 may be used. Further, it is desirable that the resist material contains a compound having an epoxy group, which permits the resist film to be cured easily.

Besides, here, the resist film 22 using such a resist material is formed in a thickness of about 3.5 to 6.0 µm. This ensures that the rugged shape on the face side of the TFT substrate 20 is sufficiently leveled off, and the structure composed of the resist film 22 is formed in a sufficient height.

Next, the resist film 22 formed in the large thickness is subjected to multi-step pattern exposure in which exposure is controlled. Here, since the positive-type resist is used to form the resist film 22, multi-step exposure is conducted in which light exposure is controlled to be smaller in an area where the resist film 22 is to be left in a larger thickness after a developing treatment.

For example, a contact part 22c just over the wiring 11 is subjected to exposure in a largest light exposure for forming the contact holes as through-holes by entirely removing the resist film 22 there. On the other hand, a spacer part 22s for forming a columnar spacer for controlling the cell gap in the liquid crystal display device is prevented from being irradiated with the exposure light, whereby the resist film 22 is made to be left in a largest thickness there. Besides, in the display region 1a, a transmitting display part it is subjected to exposure in a larger light exposure than a reflecting display part 1r, since the transmitting display part it is to be so dug as to be lower in level than the reflecting display part 1r, with a step therebetween. The reflecting display part 1r is subjected to exposure for providing a light diffusing surface having a rugged surface shape. Furthermore, the transmitting display part it and the reflecting display part 1r are subjected to exposure for providing recessed or projected orienting elements for regulating the orientation of liquid crystal molecules constituting a liquid crystal layer, as occasion demands.

Incidentally, in the first embodiment, it suffices to subject the peripheral region 1b to exposure such that the resist film 22 will be left in a requisite thickness.

In the exposure as above, it is important that of the thin film transistors Tr, particularly, channel parts ch of the p-type thin film transistors p-Tr are prevented from being irradiated with light having a wavelength of shorter than 260 nm. Usually, such exposure is conducted by use of a stepper having an extra-high pressure mercury lamp as a light source. Bright lines of the exposure light radiated from the extra-high pressure mercury lamp are 365 nm (g line)/405 nm (h line)/436 nm (i line), and the channel parts ch are not irradiated with light having a wavelength of shorter than 260 nm. Therefore, the exposure here can be carried out by applying the related-art exposure technology using a stepper having the extra-high pressure mercury lamp.

After the multi-step exposure as above, the resist film 22 is subjected to a developing treatment to perform patterning by which the exposed parts are dissolved in a developing solution.

This produces a resist pattern 24 in which, as shown in FIG. 1C, the resist film 22 is patterned into such a shape that a predetermined step d to have the transmitting display part it at a lower level and the reflecting display part 1r at an upper level is provided, the reflecting display part 1r is provided with a light diffusing surface 24b having a rugged shape, and a contact hole 24c reaching the wiring 11 and a columnar spacer 24s are provided. In addition, recessed or projected orienting elements are formed in a patterned manner, as occasion demands.

Subsequently, steps for curing the resist pattern 24 are carried out, which together with the subsequent steps constitute a prime part of the first embodiment. Now, the curing process will be described below using a flowchart shown in FIG. 2.

First, in step S1, the substrate provided with the resist pattern as above-described is subjected to a drying treatment. This causes removal of moisture (water) from the atmosphere surrounding the resist pattern and from the resist film. The drying treatment is carried out by reduced-pressure drying or by a combination of reduced-pressure drying with heating drying. Incidentally, in the case of the combination with heating drying, it is important to prevent reflow of the resist material from occurring, by maintaining the heating temperature below the glass transition point of the resist material.

Here, the treating conditions used in the drying treatment step become parameters for controlling the ruggedness of the surface shape of the resist pattern after heat curing. Specifically, by varying the reduced pressure value (degree of vacuum) and the heating temperature as the treating conditions in the drying treatment, the fluidity of the resist material at the time of heat curing is controlled. This ensures that the ruggedness of the surface shape of the resist pattern after the heat curing is controlled within a range smaller than that immediately after the developing treatment. In view of this, it is preferable that treating conditions for bringing the ruggedness of the surface shape of the resist pattern after heat curing into a predetermined state are preliminarily detected, for example, by conducting a preliminary experiment, and the drying treatment is carried out under the treating conditions thus detected.

Next, in step S2-1, the resist pattern having undergone the drying treatment is irradiated with light containing ultraviolet light in a dry atmosphere filled with a dry gas. Especially, here, it is important to conduct the irradiation in the condition where the channel parts of the thin film transistors are prevented from being irradiated with light having a wavelength of shorter than 260 nm.

Here, an inert gas such as nitrogen ($N_2$), helium (He), argon (Ar), etc. is used as the dry gas. Therefore, for example, a dry gas with a dew point of not higher than −60° C. is preferably used; as an example, a nitrogen ($N_2$) atmosphere with a dew point of −60° C. (moisture concentration: about 11 ppm) is used.

In addition, it is important to prevent volatilization (degassing) of low molecular weight compounds from the resist pattern, and it is preferable to maintain the pressure of the dry gas atmosphere at around the atmospheric pressure. It is to be noted here that the dry atmosphere may be a vacuum atmosphere or a reduced-pressure atmosphere.

Incidentally, the moisture concentration in the treating atmosphere is preferably kept at or below 4,000 ppm, but the moisture concentration may be moderated to a certain extent depending on the shape accuracy necessary for the resist pattern.

In addition, the light containing ultraviolet light with which the resist pattern is irradiated preferably contains visible light together with ultraviolet light, which is used for achieving the subsequent heat curing of the resist pattern with a good shape accuracy. As the visible light, light with a wavelength of 400 to 450 nm is preferably used.

In view of the above, in this first embodiment, a light source which has bright lines in the ultraviolet and visible ranges and which is suited to irradiation of a wide area with light is used as the light source for irradiation with light. Examples of the light source which can be used here include an high pressure mercury lamp (bright lines: 254 nm/365 nm/405 nm/436 nm/546 nm/577 nm/579 nm) and a low pressure mercury lamp (bright lines: 185 nm/254 nm/436 nm/550 nm).

Besides, especially, it is important to conduct the irradiation with light in the condition where the channel parts of the thin film transistors are prevented from being irradiated with light having a wavelength of shorter than 260 nm. Therefore, the light source is equipped with an optical filter for shielding the light having a wavelength of shorter than 260 nm, and the resist pattern is irradiated with light through the optical filter.

This ensures that the resist pattern is irradiated with light which contains visible light together with ultraviolet light having a wavelength of not less than 260 nm, and, in this instance, the channel parts of the thin film transistors are prevented from being irradiated with light having a wavelength of shorter than 260 nm.

Further, the step of the irradiation with light containing ultraviolet light may be carried out under a heating condition. In this case, it is possible to prevent reflow of the resist material from occurring, by keeping the heating temperature below the glass transition point of the resist material; for example, the irradiation is carried out under heating at about 80° C.

Here, the treating conditions in the step of irradiating with light containing ultraviolet light become parameters for controlling the ruggedness of the surface shape of the resist pattern after heat curing. Specifically, by varying the light irradiation energy and the heating temperature at the time of irradiation with light as the treating conditions in the step of irradiating with light containing ultraviolet light, the fluidity of the resist material at the time of heat curing is controlled. This ensures that the ruggedness of the surface shape of the resist pattern after the heat curing is controlled within a range smaller than that immediately after the developing treatment. Therefore, it is preferable to preliminarily detect the treating conditions such as to bring the ruggedness of the surface shape of the resist pattern after heat curing into a predetermined state, for example, by conducting a preliminary experiment, and to carry out the irradiation with light containing ultraviolet light under the treating conditions thus detected.

Thereafter, in step S3, a heat curing treatment of the resist pattern is conducted. Here, heat curing at a heating temperature according to the resist material constituting the resist pattern, i.e., production burning, is conducted, whereby the resist pattern having been patterned into a predetermined shape by the developing treatment is securely cured. In such heat curing, production burning at a heating temperature of generally 200 to 300° C. is carried out.

After the above, as shown in FIG. 3, pixel electrodes 26, 28 are formed on the heat-cured resist pattern 24'. Of these pixel electrodes 26, 28, the pixel electrode 26 in the transmitting display part it is formed as a transparent electrode 26 formed of a transparent electrode material such as ITO (Indium Tin Oxide). On the other hand, the pixel electrode 28 in the reflecting display part 1r is formed as a reflecting electrode 28 formed of a material with good light reflecting characteristics such as aluminum. Here, it is important for the reflecting electrode 28 to be formed in conformity with the light diffusing surface 24b having a rugged shape which is formed at the resist pattern 24. As a result, the part of the resist pattern 24' formed with the light diffusing surface 24b and the reflecting electrode 28 constitute a diffusing reflective plate, and the surface of the reflecting electrode 28 constitutes a light diffusing reflective surface.

Incidentally, since the transparent electrode 26 and the reflecting electrode 28 constitute a pixel electrode for one pixel, these electrodes 26 and 28 are provided in the state of being connected to each other. In addition, in order to prevent the pixel circuit having the thin film transistor Tr from influencing the display, the reflecting electrode 28 is provided at such a position as to overlap with the pixel circuit. Besides, the transparent electrode 26 is connected to the wiring 11 through the contact hole 24c, and this contact portion is covered with the reflecting electrode 28. Further, the pixel electrodes 26, 28 are removed at the position of the columnar spacer 24s.

After the pixel electrodes each composed of the transparent electrode 26 and the reflecting electrode 28 are formed, an orienting film (omitted in the drawing) covering these electrodes is formed.

In addition, a second substrate 30 to be opposed to the first substrate 1 provided with the structure on the upper side thereof as above is prepared. The second substrate 30 is composed of a transparent substrate made of a glass or the like, and is provided with a counter electrode 32 formed in a solid film shape from a transparent conductive material. Besides, an orienting film (omitted in the drawing) is provided in the state of covering the counter electrode 32. Incidentally, if occasion demands, the second substrate 30 may be provided with a color filter (omitted in the drawing here) formed in a patterned manner. The color filter is provided beneath the counter electrode 32.

Next, the pixel electrodes 26, 28 formed on the side of the first substrate 1 and the counter electrode 32 formed on the side of the second substrate 30 are disposed opposite to each other, and the columnar spacer 24s is clamped therebetween. In this condition, the gap between the substrates 1 and 30 is filled with a liquid crystal layer LC containing liquid crystal molecules m, to seal the gap between the substrates 1 and 30.

In the above-mentioned manner, a liquid crystal display device 36 having the liquid crystal layer LC sandwiched between the two substrates 1 and 30 is obtained. In the liquid crystal display device 36, the resist pattern 24' covering the upper side of the first substrate 1 buries the ruggedness on the upper side of the first substrate 1, and it is formed as an integral structure provided with a plurality of recessed and projected shapes in its surface.

Specifically, the resist pattern 24' is securely heat cured, and the step (d) and the columnar spacer 24s for partially controlling the layer thickness of the liquid crystal layer LC (i.e., cell gaps g1, g2) are integrally formed, together with the light diffusing surface 24b with the rugged surface shape for diffusing display light.

According to the first embodiment described above, the step of irradiating with light containing ultraviolet light in an atmosphere filled with a dry gas (step S2-1) is conducted before the step of heat curing the resist pattern obtained by patterning through exposure and development (step S3), as has been described referring to FIG. 2. This ensures that reflow of the resist material at the time of heat curing in step S3 is prevented, and the surface shape of the resist pattern is maintained in the shape obtained by patterning through exposure and development.

Therefore, the resist pattern in an enlarged thickness can be heat cured in the condition where the rugged surface shape is maintained.

Especially, in the step of irradiating with light containing ultraviolet light (step S2-1), the light source is fitted with the optical filter for shielding the light having a wavelength of shorter than 260 nm, and the resist pattern is irradiated with light through the optical filter. This ensures that, as shown in FIG. 1C, the channel parts of the bottom gate type thin film transistors Tr beneath the resist pattern 24 are prevented from being irradiated with light having a wavelength of shorter than 260 nm, and degradation of characteristics of the thin film transistors Tr, particularly, degradation of characteristics of the p-type thin film transistors p-Tr, due to irradiation of the channel parts ch with short-wavelength light can be prevented from occurring.

As a result, by the method according to the first embodiment, it is possible to obtain a liquid crystal display device 36 having the resist pattern 24' with good heat resistance which is securely cured in the state of maintaining the shape immediately upon lithography, without any degradation of characteristics of the thin film transistors Tr covered with the resist pattern 24'.

Figure 4A:
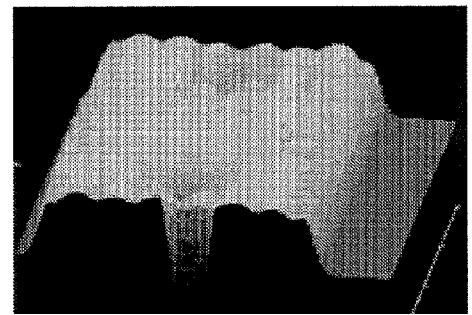
Figure 4B:
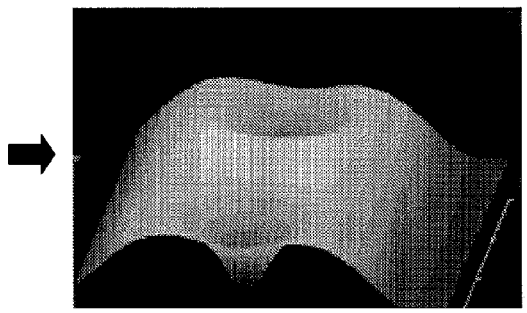

FIGS. 4R, 4A and 4B show the surface states of resist patterns having different histories. Each of the resist patterns was formed by a method in which a resist film of a positive-type resist containing a diazo compound as a photosensitive agent is formed by application (coating), and is subjected to exposure and development to form a light diffusing surface 24b having a rugged shape and a contact hole 24c.

FIG. 4R shows a resist pattern immediately upon development, wherein the shape accuracy of the light diffusing surface 24b and the contact hole 24c is maintained.

FIG. 4A shows a resist pattern cured along the flowchart of FIG. 2 in the first embodiment. Here, first, reduced-pressure drying of a resist pattern after development was conducted as step S1. Next, as step S2-1, irradiation with light containing ultraviolet light was conducted in a treating chamber filled with a nitrogen ($N_2$) atmosphere (dry gas atmosphere) with a moisture concentration of not more than 50 ppm. In this case, a high pressure mercury lamp was used as a light source, and irradiation with light was conducted through an optical filter operative to absorb not less than 99% of ultraviolet light having a wavelength of not more than 300 nm. In addition, the substrate was heated to a temperature of 80 to 100° C. Thereafter, as step S3, a heat curing treatment at 220° C. was conducted.

FIG. 4B shows a resist pattern cured without applying the first embodiment. Here, first, a resist pattern after development was irradiated with light by using an extra-high pressure mercury lamp as a light source, without being subjected to any drying treatment. Since the light from the extra-high pressure mercury lamp does not contain light having a wavelength of shorter than 260 nm, the same irradiation with light as that used in step S2-1 was practically carried out as a pre-treatment for the heat curing treatment. Thereafter, a heat curing treatment was conducted at 220° C.

By comparing these resist patterns, it could be confirmed that the resist pattern [FIG. 4A] heat cured according to the procedure of the first embodiment retains the rugged surface shape of the resist pattern [FIG. 4R] immediately after the developing treatment. On the other hand, the resist pattern [FIG. 4B] irradiated with light and heat cured, without being subjected to the drying treatment of step S1 in the first embodiment and without being subjected to the treating atmosphere and temperature control of step S2, showed reflow of the resist material at the time of heat curing, and could not retain its shape after development.

Figure 5:
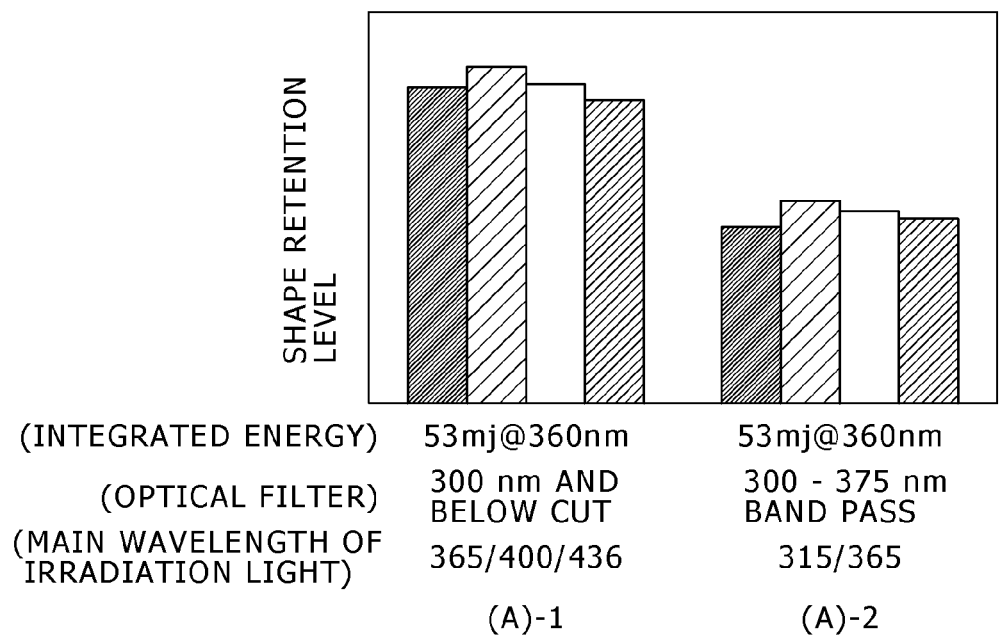
FIG. 5 shows the results of measurement of shape maintaining level of resist patterns cured by changing the wavelength range of light with which the resist pattern is irradiated in a curing treatment within the range of the first embodiment.

In addition, FIG. 5 shows the results of measurement, at four locations, of the level of retention of the resist pattern shape immediately upon development, for resist patterns cured by varying the wavelength range of the light used for irradiation in step S2-1 within the range of the first embodiment, in the resist pattern curing treatment. A high pressure mercury lamp (bright lines: 254 nm/365 nm/405 nm/436 nm/546 nm/577 nm/579 nm) was used as the light source, and the wavelength range of irradiation of the resist pattern was controlled by an optical filter.

FIG. 5, (A)-1, shows the case of irradiation with light from which light component having a wavelength of not more than 300 nm was cut off by an optical filter and which had main wavelengths of 365 nm/405 nm/436 nm/546 nm/577 nm/579 nm.

FIG. 5, (A)-2, shows the case of irradiation with light in which light component having a wavelength of 300 to 375 nm was transmitted through an optical filter and which had a main wavelength of 365 nm.

From the results shown in FIG. 5, it is seen that the resist pattern [FIG. 5, (A)-1] irradiated with visible light having a wavelength of not less than 400 nm in addition to ultraviolet light can retain the shape upon development more favorably and is higher in heat resistance, than the resist pattern [FIG. 5, (A)-2] irradiated only with ultraviolet light having a main wavelength of 365 nm. By this, the effect of irradiating with visible light in addition to ultraviolet light in step S2-1 before the heat curing treatment was confirmed.

This is interpreted as follows. In an ordinary ultraviolet curing process, it is aimed at enhancing heat resistance by breaking bonds in the resist in question and then effecting re-bonding. On the other hand, the light in the visible region of a wavelength of not less than 400 nm has only low energy of about 250 to 300 kJ/mol, and may not break the bonds. However, in the irradiation with light in a dry atmosphere described in the first embodiment above (step S2-1), the resist pattern is irradiated with light in the visible region of a wavelength of not less than 400 nm, whereby an intermediate produced upon sensitizing (exposure) of the positive-type resist can be brought into a cross-linking reaction. As a result, in the irradiation with light in a dry atmosphere (step S2-1), the resist pattern is irradiated with light in the visible region in addition to ultraviolet light, whereby the heat resistance of the resist pattern can be enhanced effectively.

Figure 6A:
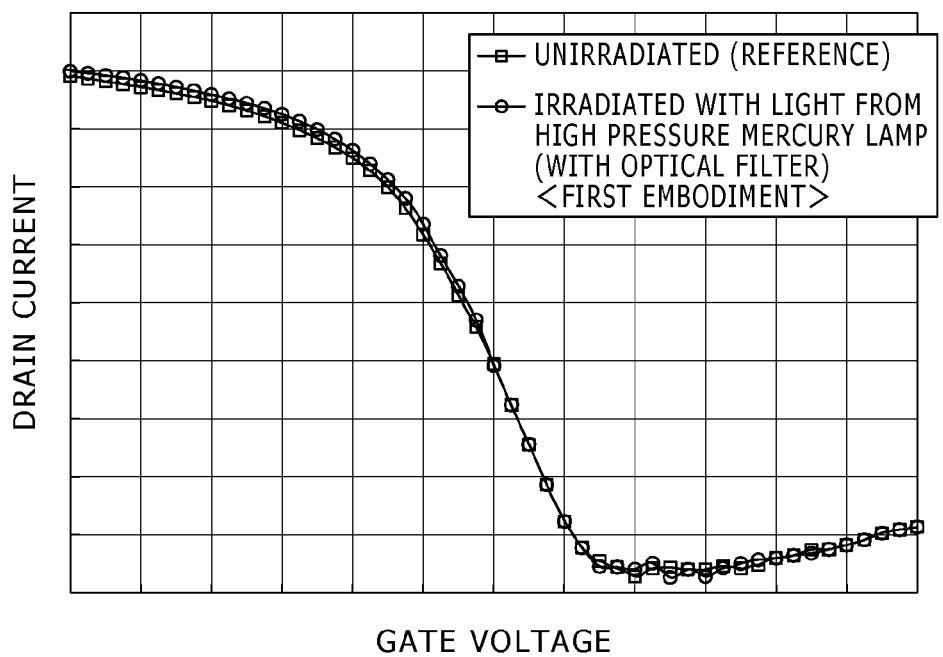
FIGS. 6A and 6B are diagrams showing the transistor characteristics of a thin film transistor beneath a resist pattern, after a curing treatment of the resist pattern according to the procedure of the first embodiment and after a comparative treatment.
Figure 6B:
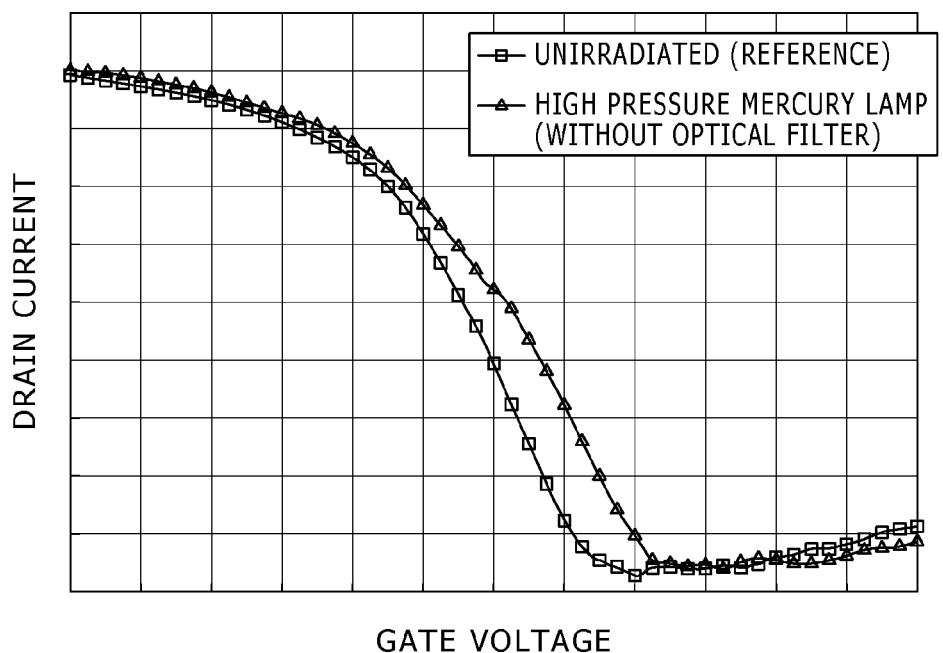

FIGS. 6A and 6B show, as transistor characteristic, the relationship between gate voltage and drain current of a p-type thin film transistor, after a curing treatment of a resist pattern formed on the bottom gate type thin film transistor.

FIG. 6A shows the transistor characteristic of the thin film transistor beneath the resist pattern cured by applying the method according to the first embodiment [HIGH PRESSURE MERCURY LAMP (WITH OPTICAL FILTER)]. In step S2-1, the resist pattern was irradiated with the light from a high pressure mercury lamp through an optical filter for shielding the light having a wavelength of shorter than 260 nm, and thereafter the heat curing treatment in step S3 was conducted. Besides, the transistor characteristic before irradiation with light [UNIRRADIATED (REFERENCE)] is shown together.

FIG. 6B shows the transistor characteristic of the thin film transistor beneath the resist pattern cured without applying the method according to the first embodiment [HIGH PRESSURE MERCURY LAMP (WITHOUT OPTICAL FILTER)]. In step S2-1, the resist pattern was irradiated with the light from a high pressure mercury lamp containing light having a wavelength of shorter than 260 nm, and thereafter the heat curing treatment in step S3 was conducted. Besides, the transistor characteristic before irradiation with light [UNIRRADIATED (REFERENCE)] is shown together.

By comparing these transistor characteristics, it was confirmed that the characteristic of the thin film transistor beneath the resist pattern heat cured in the procedure of the first embodiment [FIG. 6A] retained the characteristic before irradiation with light [UNIRRADIATED (REFERENCE)] and was free of degradation. On the other hand, the characteristic of the thin film transistor beneath the resist pattern formed without applying the first embodiment, specifically, the resist pattern irradiated with the light having a wavelength of shorter than 260 nm before the heat curing treatment [FIG. 6B] was confirmed to show a degradation, specifically, a shifting of threshold voltage, as compared with the characteristic before irradiation with light [UNIRRADIATED (REFERENCE)].

Figure 7:
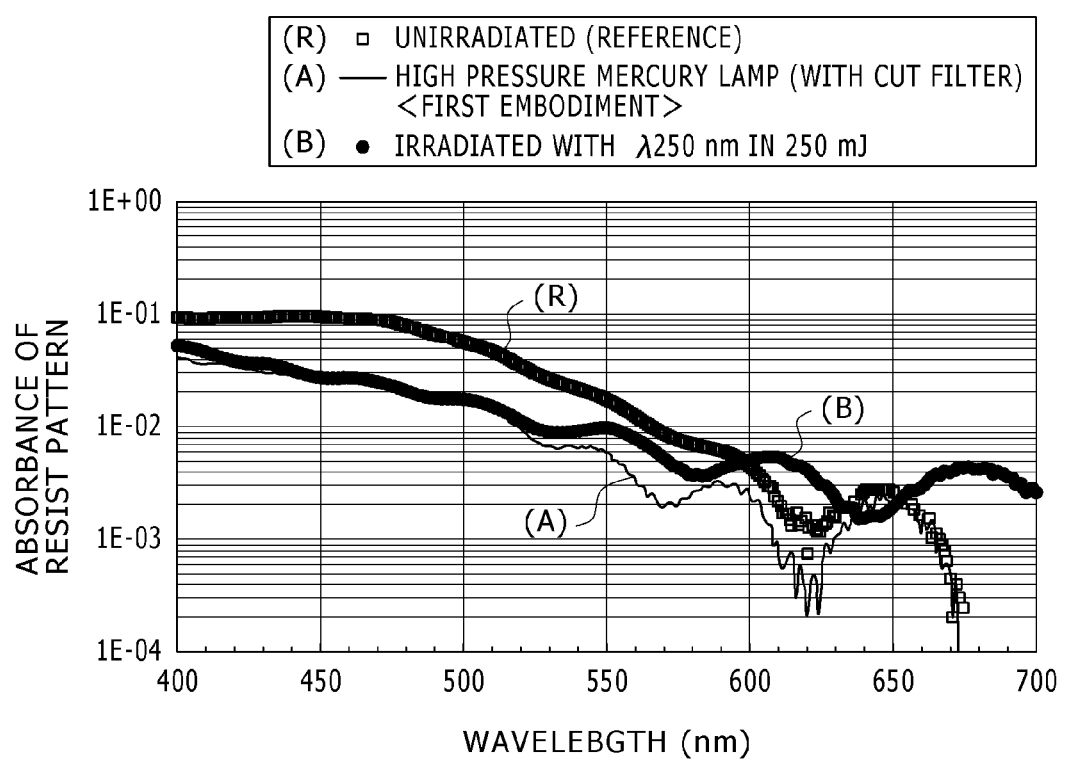
FIG. 7 is a diagram showing the absorption spectra of resist patterns obtained according to the procedure and histories in the first embodiment.

In addition, FIG. 7 shows absorption spectra of resist patterns having different histories. In the diagram, (R) is the absorption spectrum of a resist pattern immediately upon development; (A) is the absorption spectrum of a resist pattern cured along the flowchart of FIG. 2 in the first embodiment; and (B) is the absorption spectrum of a resist pattern formed without applying the first embodiment, specifically, a resist pattern formed by a heat curing treatment after irradiation with ultraviolet light having a wavelength of 250 nm.

Based on the comparison of these absorption spectra, in the first embodiment, the resist pattern is irradiated with visible light in addition to ultraviolet light in step S2-1. Therefore, the resist pattern is irradiated with light having a wavelength in the range of 270 to 600 n, hitherto used in a decoloring treatment of a positive-type resist, whereby a decoloring effect can also be obtained. As a result, for example in the transmitting display part it shown in FIG. 3, enhancement of luminance (brightness) of the display light can be promised, without performing any special decoloring step.

Second Embodiment

A second embodiment is assumed to differ from the first embodiment in that the resist pattern itself is used as a light shielding film for channel parts of thin film transistors in irradiating the resist pattern with light as a preliminary step for a heat curing treatment of the resist pattern.

In this case, the step described referring to FIG. 1C in the first embodiment above is conducted in the same manner as above, to form circuits using thin film transistors in the display region 1a and the peripheral region 1b on the first substrate 1, thereby obtaining a TFT substrate 20.

Next, as shown in FIG. 1B, an uncured resist film 22 is formed on the TFT substrate 20 by application (coating). In this case, an acrylic positive-type photoresist or a cresol-novolak resin photoresist showing great light absorption on the short wavelength side is used. In addition, here, multi-step exposure such that the light exposure is controlled to be smaller in an area where the resist film 22 is to be left in a larger thickness after a developing treatment, as described in the first embodiment above, is conducted. Therefore, it is preferable to use the acrylic positive-type photoresist which is the same as or similar to that in the first embodiment.

Besides, in this second embodiment, it is important to apply the resist film 2 in a sufficient thickness so that a resist pattern in a sufficient film thickness will be formed after the developing treatment, in the region where p-type thin film transistors p-Tr are provided, i.e., in the peripheral region 1b. The requisite film thickness of the resist pattern formed in the peripheral region 1b depends on the composition of the resist material, and is assumed to be such a thickness as to be able to shield, by absorbing, the light having a wavelength of shorter than 260 nm.

Thereafter, the resist film 22 formed by applying in a large thickness is subjected to multi-step pattern exposure in which the light exposure is controlled in the same manner as in the first embodiment. It is to be noted here, however, that in the second embodiment the exposure is not needed for at least those portions of the resist film 22 which are located on the upper side of the p-type thin film transistors p-Tr in the peripheral region 1b.

In the exposure as above, like in the first embodiment, it is important that particularly the channel parts ch of the p-type thin film transistors p-Tr, of the thin film transistors Tr, are prevented from being irradiated with light having a wavelength of shorter than 260 nm. Therefore, like in the first embodiment, the exposure can be carried out by applying the related-art exposure technology using a stepper having an extra-high pressure mercury lamp as a light source.

After the multi-step exposure as above, the resist film 22 is subjected to a developing treatment, so as to dissolve the exposed portions into a developing solution, thereby patterning the resist film 22.

Consequently, as shown in FIG. 1C, it is possible to obtain a resist pattern 24 by patterning the resist film 22 into such a shape that a predetermined step d for having a transmitting display part it at a lower level and a reflecting display part 1r at an upper level is provided, the reflecting display part 1r is provided with a light diffusing surface 24b having a rugged shape, and a contact hole 24c reaching a wiring 11 and a columnar spacer 24s are provided. In addition, if occasion demands, recessed or projected orienting elements are formed in a patterned manner. Especially, at least on the p-type thin film transistors p-Tr in the peripheral region 1b, a resist pattern 24 is formed in such a thickness as to be able to shield, by absorbing, the light having a wavelength of shorter than 260 nm.

The next and subsequent steps constitute a process of curing the resist pattern 24. Now, the curing process will be described below using a flowchart shown in FIG. 8. In this second embodiment, step S2-2 is a prime part, whereas steps S1 and S3 may be the same as in the first embodiment, and description thereof is omitted here.

First, in step S1, the substrate provided with the resist pattern is subjected to a drying treatment. Thereafter, in step S2-2, the resist pattern having undergone the drying treatment is irradiated with light containing ultraviolet light in an atmosphere filled with a dry gas. In this case, like in the first embodiment, the irradiation with light is conducted in the condition where the channel parts of the thin film transistors are prevented from being irradiated with light having a wavelength of shorter than 260 nm. In the second embodiment, the shielding of the light having a wavelength of shorter than 260 nm is performed by the resist pattern, and the other configurations are the same as in step S2-1 of the first embodiment.

Specifically, as the dry gas, an inert gas is used in the same manner as in the first embodiment.

In addition, as the light containing ultraviolet light with which the resist pattern is irradiated, visible light is used together with the ultraviolet light, which is used to perform the subsequent heat curing of the resist pattern with a good shape accuracy, like in the first embodiment. Therefore, as the light source for irradiation with light, a light source which has bright lines in the ultraviolet and visible ranges and which is suited to irradiation of a wide area with light is used. Examples of the light source for use here include a high pressure mercury lamp (bright lines: 254 nm/365 nm/405 nm/436 nm/546 nm/577 nm/579 nm) and a low pressure mercury lamp (bright lines: 185 nm/254 nm/436 nm/550 nm).

Besides, the resist pattern is irradiated with light containing visible light together with ultraviolet light, whereby the resist pattern formed in a sufficient film thickness particularly in the peripheral region is permitted to function as a light shielding film, so that the channel parts of the p-type thin film transistors are prevented from being irradiated with light having a wavelength of shorter than 260 nm.

Incidentally, like in the first embodiment, the step of irradiating with light containing ultraviolet light may be conducted in a heating condition. In addition, the treating conditions in the step of irradiation with the light containing ultraviolet light become parameters for controlling the ruggedness of the surface shape of the resist pattern after heat curing, in the same manner as above. Therefore, like in the first embodiment, it is preferable to preliminarily detect the treating conditions such as to bring the ruggedness of the surface shape of the resist pattern after heat curing into a predetermined state, for example, by conducting a preliminary experiment, and to conduct the irradiation of the resist pattern with the light containing ultraviolet light under the treating conditions thus detected.

Thereafter, in step S3, a heat curing treatment of the resist pattern is conducted, in the same manner as in the first embodiment.

Further, after the above, a liquid crystal display device 36 having a liquid crystal layer LC sandwiched between two substrates 1 and 30 is obtained, in the same manner as described referring to FIG. 3 in the first embodiment above.

In the liquid crystal display device 36, a resist pattern 24' covering the upper side of the first substrate 1 is formed as an integral structure which buries the ruggedness on the upper side of the first substrate 1 and which is provided with a plurality of recessed and projected shapes at the surface thereof.

Figure 8:
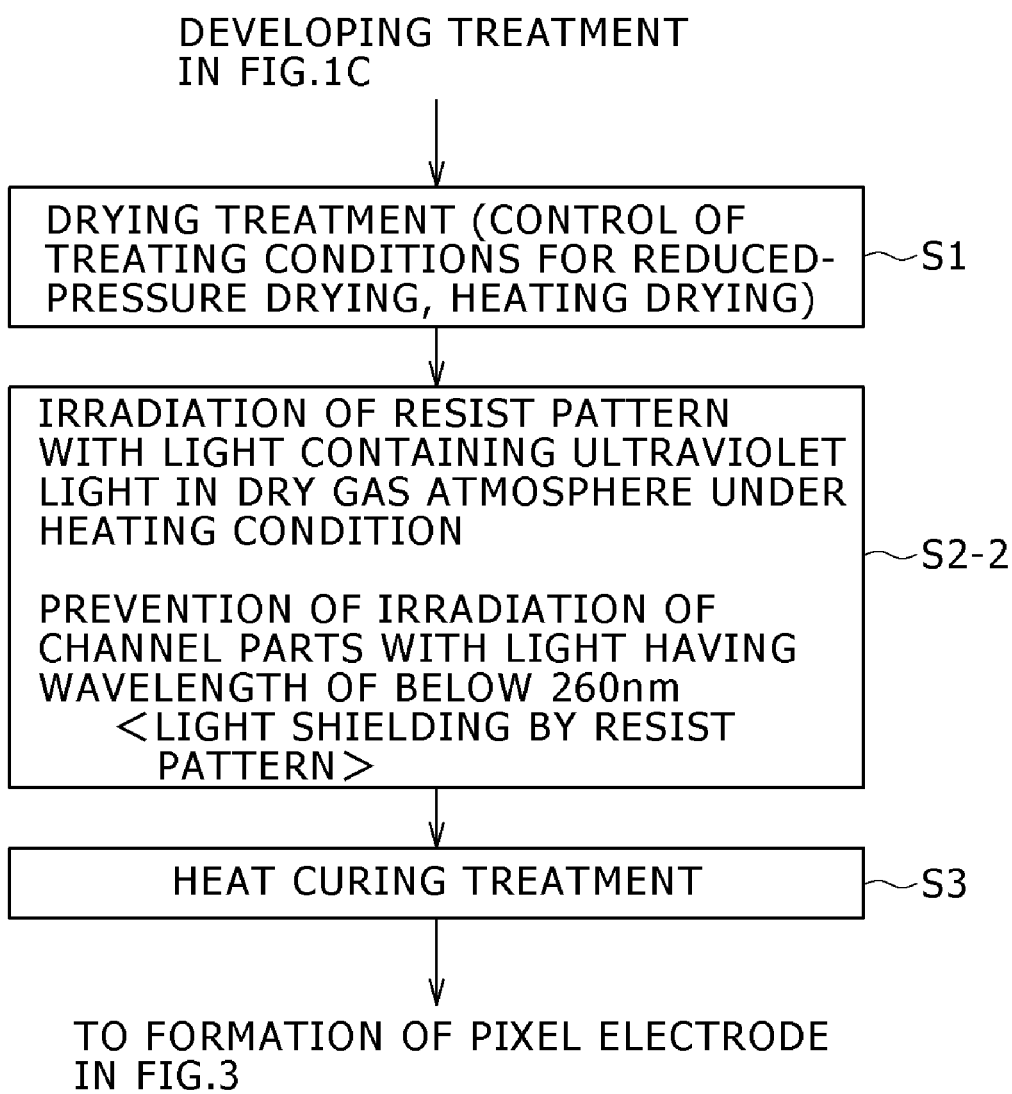
FIG. 8 is a flowchart illustrating a prime part of the manufacturing method according to the second embodiment.

According to the second embodiment as above, as has been described referring to FIG. 8, a step of irradiating with light containing ultraviolet light in an atmosphere filled with a dry gas (step S2-2) is conducted before the step of heat curing the resist pattern obtained by patterning through exposure and development. This ensures that reflow of the resist material at the time of heat curing in step S3 is prevented from occurring, and the surface shape of the resist pattern is maintained in the shape obtained by patterning through exposure and development.

Therefore, like in the first embodiment, the resist pattern formed in an enlarged thickness can be heat cured in the state of retaining the rugged surface shape thereof.

Particularly, in the step of irradiating with light containing ultraviolet light (step S2-2), the resist pattern formed in a sufficient film thickness in the peripheral region where the p-type thin film transistors are provided is used as a light shielding film for the light having a wavelength of shorter than 260 nm. This ensures that, as shown in FIG. 1C, the channel parts of the bottom gate type thin film transistors Tr provided in the peripheral region 1b can be prevented from being irradiated with light having a wavelength of shorter than 260 nm, and degradation of characteristics of the p-type thin film transistors p-Tr due to irradiation of the channel parts ch with short-wavelength light can be prevented from occurring.

Consequently, by the method according to this second embodiment, it is possible to obtain a liquid crystal display device 36 having a resist pattern 24' with good heat resistance which is securely cured in the state of retaining its shape immediately upon lithography, without any degradation of characteristics of the thin film transistors Tr covered with the resist pattern 24'.

Figure 9:
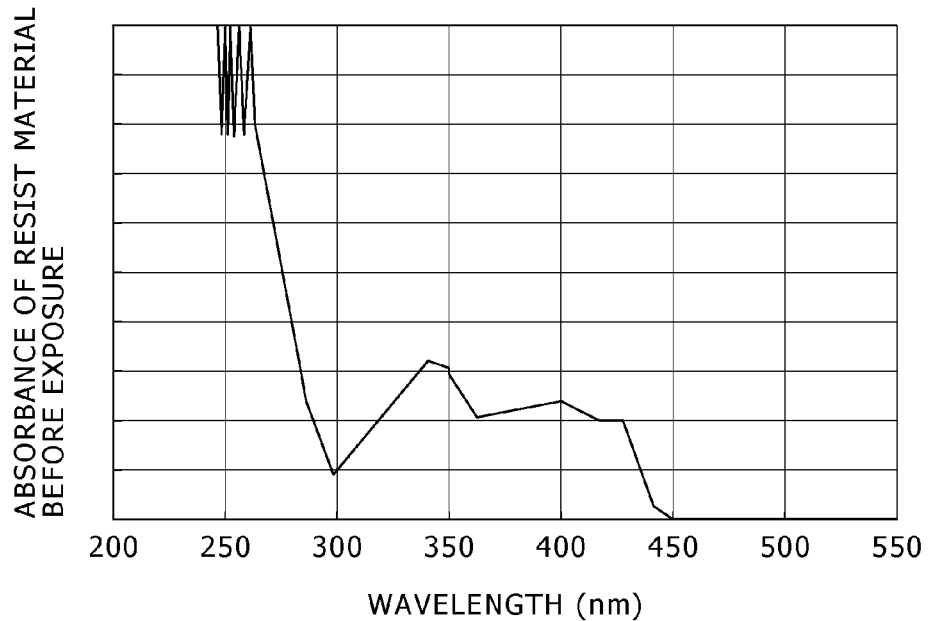
FIG. 9 is a diagram showing the absorption spectrum, before exposure to light, of a resist material used in the second embodiment.

Here, FIG. 9 shows an absorption spectrum before exposure, for a resist material (acrylic positive-type photoresist) used in the second embodiment. As shown in this diagram, it is important in the second embodiment to use a resist material showing a high absorption coefficient on the shorter wavelength side as compared with 260 nm.

Figure 10:
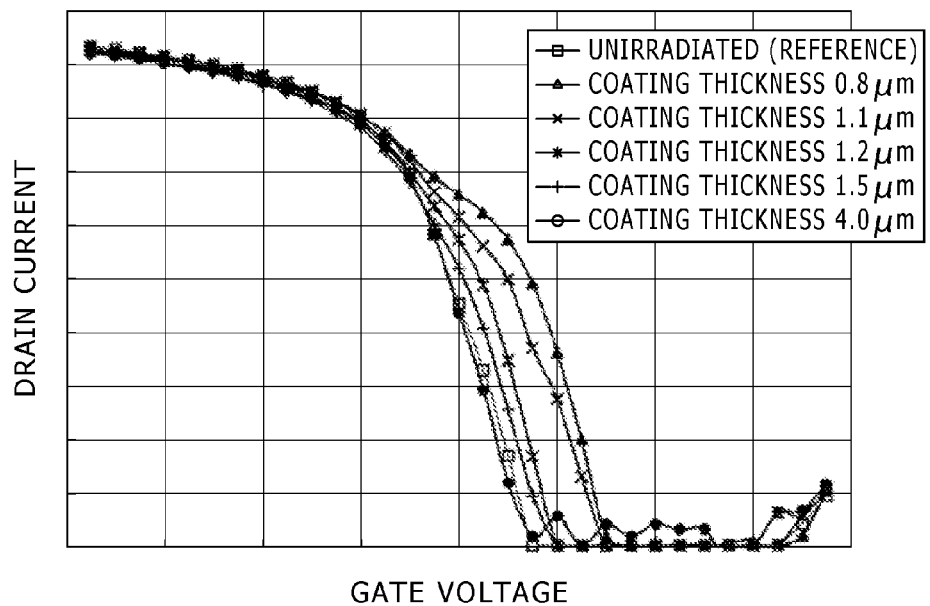
FIG. 10 is a diagram showing the transistor characteristics of a thin film transistor beneath resist patterns, different in film thickness, of the resist material showing the absorption spectrum of FIG. 9.

FIG. 10 shows transistor characteristic (relationship between gate voltage and drain current) in the case where resist patterns using the resist material showing the absorption spectrum of FIG. 9 were formed in different film thicknesses on a bottom gate type p-type thin film transistor, and were irradiated with 2000 mJ/cm$^2$ of light having a wavelength of 250 nm. Besides, transistor characteristic in the case where the resist pattern was not irradiated with the light having a wavelength of 250 nm was shown as a reference.

From FIG. 10 it is seen that when a resist material having a light absorption on the shorter wavelength side as compared with 260 nm is used, it is possible to suppress the shifting of the threshold value of the p-type thin film transistor due to irradiation with light on the shorter wavelength side as compared with 260 nm (light having a wavelength of 250 nm), by forming the resist pattern in an enlarged film thickness. As an example, it was confirmed that in the case of irradiation with 2000 mJ/cm$^2$ of light having a wavelength of 250 nm, it is possible to perfectly preventing the shifting of the threshold value of the p-type thin film transistor, by forming the resist pattern in a large film thickness of about 4.0 μm.

Then, it is seen that it suffices for the film thickness of the resist pattern formed on the channel parts of the p-type thin film transistors to be set at such a value as to make it possible to prevent the shifting of the threshold value of the p-type thin film transistor by the energy of the light used for irradiation in step S2-2.

Besides, in view of the fact that the resist pattern serves as the light shielding film for the channel parts of the thin film transistors as above-mentioned, even when exposure light containing a wavelength shorter than 260 nm is used for pattern exposure in applying lithography to the resist film, degradation of characteristics of the thin film transistors due to the exposure light can be prevented from occurring.

Third Embodiment

A third embodiment is assumed to differ from the first embodiment in that a gate electrode is used as a light shielding film for a channel part of a thin film transistor in conducting irradiation of a resist pattern with light as a preliminary step for a heat curing treatment of the resist pattern.

First, in the third embodiment, the steps shown in FIGS. 1A to 1C are conducted in the same manner as described in the first embodiment above, to form bottom gate type thin film transistors Tr on a first substrate 1 and to form a resist pattern 24 covering them.

Figure 11:
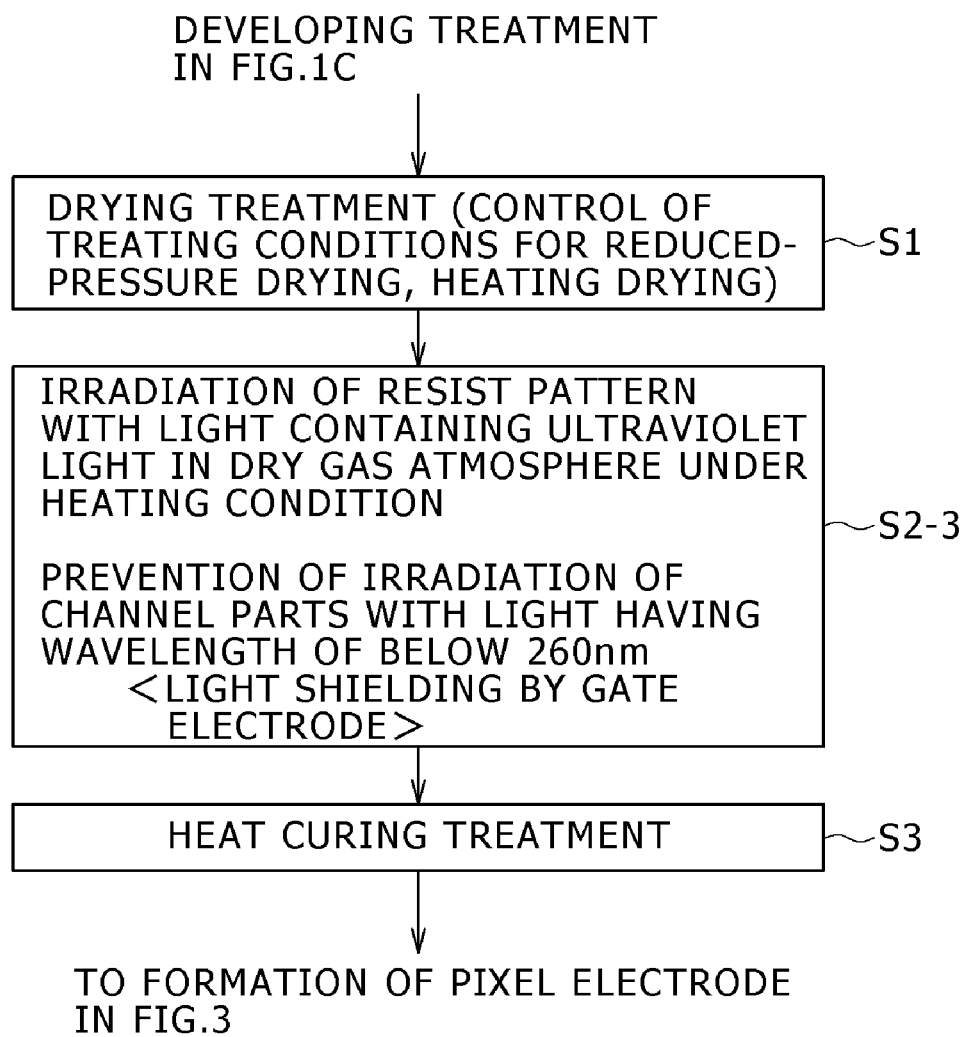
FIG. 11 is a flowchart illustrating a prime part of the manufacturing method according to the third embodiment.

Next, a step of curing the resist pattern 24 is carried out as shown in a flowchart in FIG. 11. In this third embodiment, step S2-3 is characteristic, whereas steps S1 and S3 may be the same as in the first embodiment, and description thereof is omitted here.

First, in step S1, the substrate provided with the resist pattern is subjected to a drying treatment. Thereafter, in step S2-3, the resist pattern having undergone the drying treatment is irradiated with light containing ultraviolet light in an atmosphere filled with a dry gas. In this case, like in the first embodiment, the irradiation is conducted in the condition where the channel parts of the thin film transistors are prevented from being irradiated with light having a wavelength of shorter than 260 nm. In this third embodiment, the shielding of the light having a wavelength of shorter than 260 nm is conducted by the gate electrode, and the other configurations are the same as in step S2-1 of the first embodiment.

Specifically, as the dry gas, an inert gas is used in the same manner as in the first embodiment.

In addition, like in the first embodiment, as the light containing ultraviolet light with which the resist pattern is to be irradiated, visible light for enhancing the light transmittance of the heat-cured resist pattern is preferably used together with ultraviolet light, which is used for conducting the subsequent heat curing of the resist pattern with good shape accuracy. Therefore, as a light source for irradiation with light, a light source which has bright lines in the ultraviolet and visible ranges and which is suited to irradiation of a wide area with light is used. Examples of the light source for use here include a high pressure mercury lamp (bright lines: 254 nm/365 nm/405 nm/436 nm/546 nm/577 nm/579 nm) and a low pressure mercury lamp (bright lines: 185 nm/254 nm/436 nm/530 nm).

Figure 12:
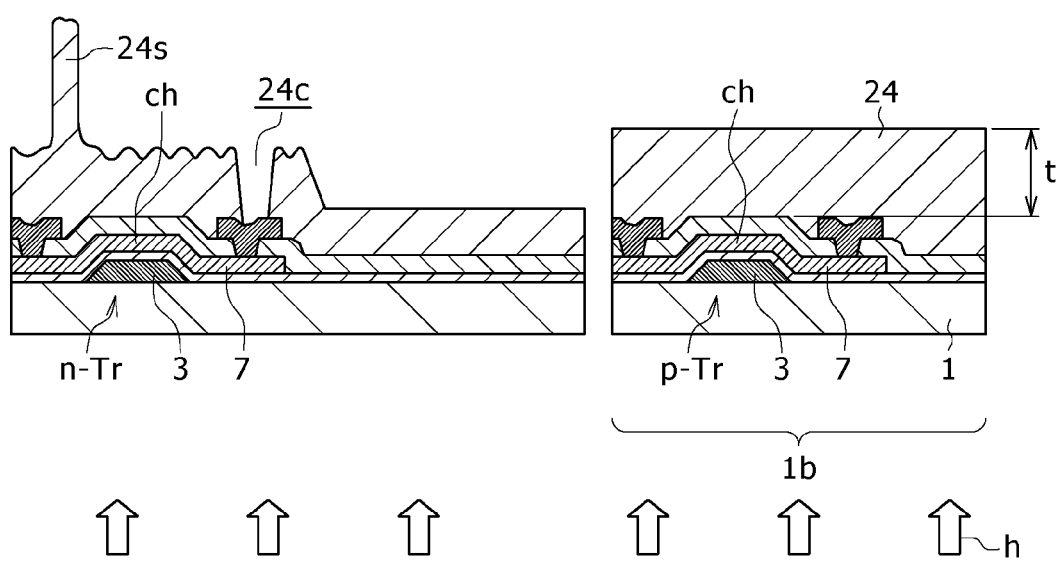
FIG. 12 is an essential part sectional view illustrating a prime part of the manufacturing method according to the third embodiment.

Especially, in this third embodiment, as shown in FIG. 12, irradiation with the above-mentioned light h containing ultraviolet light is conducted from the back side of the first substrate 1. This ensures that, in each of the thin film transistors Tr, the gate electrode 3 serves as a light shielding film for the channel part ch of a semiconductor layer 7, whereby irradiation of the channel part ch with the light h is prevented. Thus, the channel parts ch of the p-type thin film transistors p-Tr formed in the peripheral region 1b are prevented from being irradiated with light having a wavelength of shorter than 260 nm.

Incidentally, the step of irradiating with the light containing ultraviolet light may be conducted under a heating condition, like in the first embodiment. Besides, the treating conditions in the step of irradiating with the light containing ultraviolet light become parameters for controlling the ruggedness of the surface shape of the resist pattern after heat curing, in the same manner as above. Therefore, like in the first embodiment, it is preferable to preliminarily detect the treating conditions such as to bring the ruggedness of the surface shape of the resist pattern after heat curing, for example, by conducting a preliminary experiment, and to perform the irradiation with light containing ultraviolet light under the treating conditions thus detected.

Thereafter, in step S3, a heat curing treatment of the resist pattern is conducted, in the same manner as in the first embodiment.

Further, after the above, a liquid crystal display device 36 having a liquid crystal layer LC sandwiched between two substrates 1 and 30 is obtained, in the same manner as described referring to FIG. 3 in the first embodiment above.

In the liquid crystal display device 36, a resist pattern 24' covering the upper side of the first substrate 1 is formed as an integral structure which buries the ruggedness on the upper side of the first substrate 1 and which is provided with a plurality of recessed and projected shapes at its surface.

According to the third embodiment as above, as has been described referring to FIGS. 11 and 12, the step of irradiating with light containing ultraviolet light in an atmosphere filled with a dry gas (step S2-3) is conducted before the step of heat curing the resist pattern obtained by patterning through exposure and development (step S3). This ensures that reflow of the resist material at the time of heat curing in step S3 is prevented from occurring, and the surface shape of the resist pattern is maintained in the shape obtained by patterning through exposure and development.

Therefore, like in the first embodiment, the resist pattern formed in an enlarged film thickness can be heat cured in the state of retaining the rugged surface shape.

Particularly, in the step of irradiating with light containing ultraviolet light (step S2-3), as shown in FIG. 12, irradiation with the light h containing ultraviolet light is conducted from the back side of the first substrate 1 while using the gate electrodes as a light shielding film, whereby the channel parts ch of the bottom gate type thin film transistors Tr are prevented from being irradiated with light having a wavelength of shorter than 260 nm. By this, it is possible to prevent degradation of characteristics of the p-type thin film transistors p-Tr due to irradiation of the channel parts ch with short-wavelength light.

Consequently, by the method according to the third embodiment, it is possible to obtain a liquid crystal display device 36 having the resist pattern 24' with good heat resistance which is securely cured in the state of retaining its shape immediately upon lithography, without any degradation of characteristics of the thin film transistors Tr covered with the resist pattern 24'.

Fourth Embodiment

A fourth embodiment is assumed to differ from the first embodiment in that a light source generating only light having a wavelength of not less than 260 nm is used at the time of performing irradiation of a resist pattern with light as a preliminary step for a heat curing treatment of the resist pattern.

First, in this fourth embodiment, the steps shown in FIGS. 1A to 1C are carried out in the same manner as described in the first embodiment, to form bottom gate type thin film transistors Tr on a first substrate 1, and to form a resist pattern 24 covering them.

Figure 13:
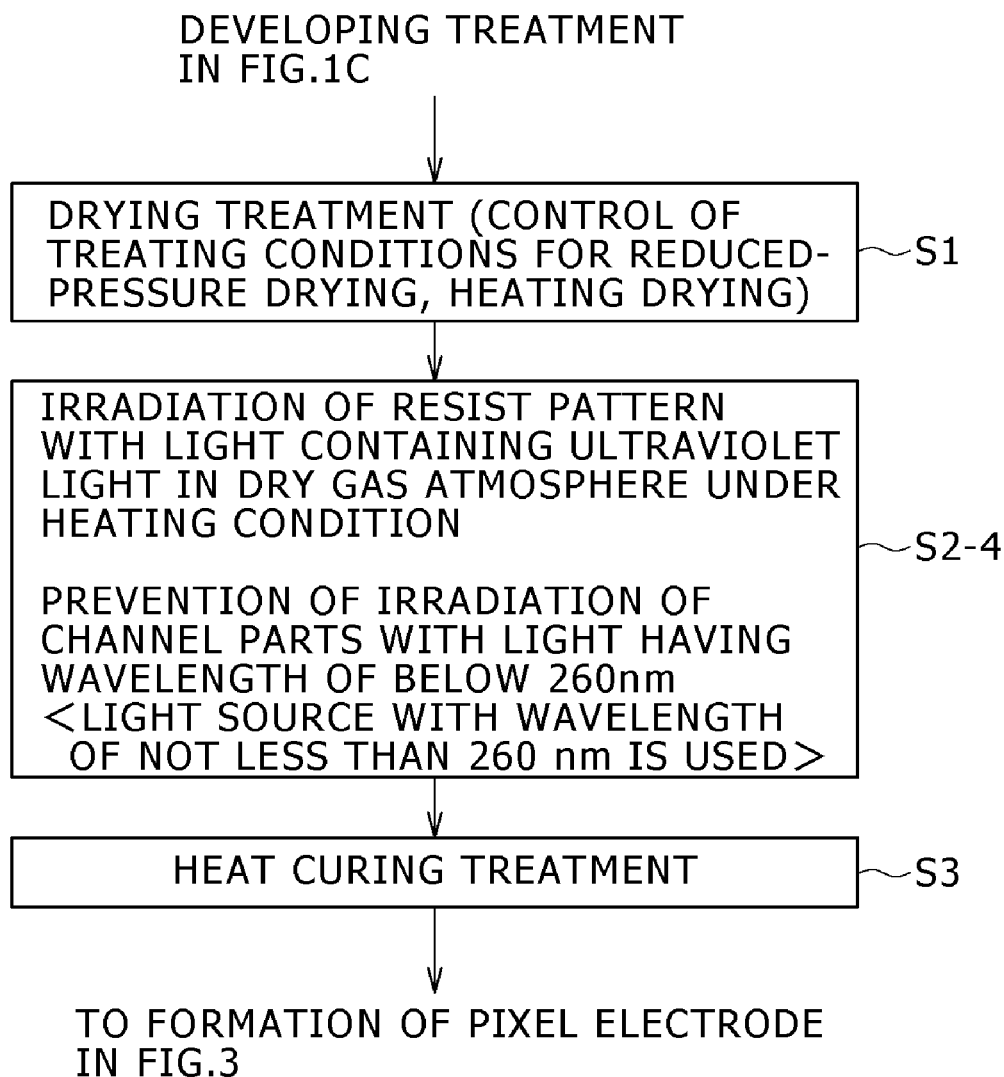
FIG. 13 is a flowchart illustrating a prime part of the manufacturing method according to the fourth embodiment.

Next, a step of curing the resist pattern 24 is conducted as shown in a flowchart in FIG. 13. In this fourth embodiment, step S2-4 is a prime, whereas steps S1 and S3 may be the same as in the first embodiment, so that description thereof is omitted here.

First, in step S1, the substrate provided with the resist pattern is subjected to a drying treatment. Thereafter, in step S2-3, the resist pattern having undergone the drying treatment is irradiated with light containing ultraviolet light in an atmosphere filled with a dry gas. In this case, like in the first embodiment, the irradiation is conducted in the condition where the channel parts of the thin film transistors are prevented from being irradiated with light having a wavelength of shorter than 260 nm. In the fourth embodiment, a light source generating only light having a wavelength of not less than 260 nm is used as a light source for supplying light containing ultraviolet light, and the other configurations are the same as in step S2-1 of the first embodiment.

Specifically, as the dry gas, an inert gas is used in the same manner as in the first embodiment.

In addition, as the light containing ultraviolet light with which to irradiate the resist pattern, like in the first embodiment, visible light for enhancing the light transmittance of the heat-cured resist pattern is preferably used together with ultraviolet light, which is used for performing the subsequent heat curing of the resist pattern with good shape accuracy. Therefore, here, a light source which generates only light with a wavelength of not less than 260 nm and which has bright lines in the ultraviolet and visible ranges is used as the light source for irradiation with light. For example, an extra-high pressure mercury lamp (bright lines: 365 nm/405 nm/436 nm) is used.

It should be noted here that the extra-high pressure mercury lamp is a point-like source of light. Therefore, in order to effectively irradiate a wide area of the first substrate 1 with the light containing ultraviolet light having a wavelength of not less than 260 nm, a mirror and/or a lens is provided for the light source, so as to widen the irradiation light into a line-like form or a plane-like form.

Incidentally, like in the first embodiment, the step of irradiating with the light containing ultraviolet light may be conducted under a heating condition. Besides, the treating conditions in the step of irradiating with the light containing ultraviolet light become parameters for controlling the ruggedness of the surface shape of the resist pattern after heat curing, in the same manner as above. Therefore, like in the first embodiment, it is preferable to preliminarily detect the treating conditions such as to bring the ruggedness of the surface shape of the resist pattern after heat curing into a predetermined state, and to perform the irradiation with the light containing ultraviolet light under the treating conditions thus detected.

Thereafter, in step S3, like in the first embodiment, a heat curing treatment of the resist pattern is conducted.

Further, after the above, a liquid crystal display device 36 having a liquid crystal layer LC sandwiched between two substrates 1 and 30 is obtained, in the same manner as described referring to FIG. 3 in the first embodiment above.

In the liquid crystal display device 36, a resist pattern 24' covering the first substrate 1 is formed as an integral structure which buries the ruggedness on the upper side of the first substrate 1 and which is provided with a plurality of recessed and projected shapes at its surface.

According to the fourth embodiment as above-described, as has been described referring to FIG. 13, the step of irradiating with light containing ultraviolet light in an atmosphere filled with a dry gas (step S2-4) is conducted before the step of heat curing the resist pattern obtained by patterning through exposure and development (step S3). This ensures that reflow of the resist material at the time of heat curing in step S3 is prevented from occurring, and the surface shape of the resist pattern is maintained in the shape obtained by patterning through exposure and development.

Therefore, like in the first embodiment, the resist pattern formed in an enlarged film thickness can be heat cured in the state of retaining the rugged surface shape.

Particularly, in the step of irradiating with the light containing ultraviolet light (step S2-4), the resist pattern is irradiated with light by using a light source which generates only light in a wavelength range of not less than 260 nm and which has bright lines in the ultraviolet and visible ranges, such as an extra-high pressure mercury lamp (bright lines: 365 nm/405 nm/436 nm). This ensures that, as shown in FIG. 1C, the channel parts of the bottom gate type thin film transistors Tr beneath the resist pattern 24 can be prevented from being irradiated with light having a wavelength of shorter than 260 nm, and degradation of characteristics of the thin film transistors Tr, specifically, degradation of characteristics of the p-type thin film transistors p-Tr, due to irradiation of the channel parts ch with short-wavelength light, can be prevented from occurring.

Consequently, by the method according to the fourth embodiment, it is possible to obtain a liquid crystal display device 36 having the resist pattern 24' with good heat resistance which is securely cured in the state of retaining its shape immediately upon lithography, without any degradation of characteristics of the thin film transistors Tr covered with the resist pattern 24'.

Figure 14:
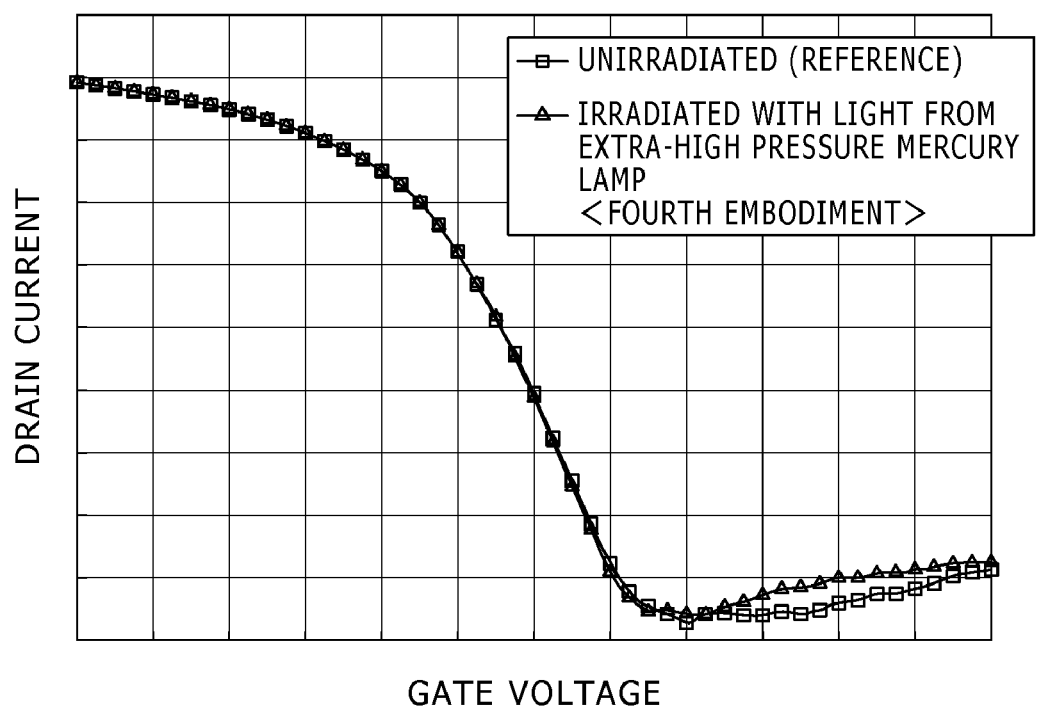
FIG. 14 is a diagram showing the transistor characteristics of a thin film transistor beneath a resist pattern cured by applying the method according to the fourth embodiment, together with a reference.

Here, FIG. 14 shows transistor characteristic of the thin film transistors beneath the resist pattern cured by applying the method of the fourth embodiment [IRRADIATION WITH LIGHT FROM EXTRA-HIGH PRESSURE MERCURY LAMP]. In this case, the resist pattern was irradiated with light from an extra-high pressure mercury lamp in step S2-4, and, thereafter, the heat curing treatment in step S3 was carried out. Besides, transistor characteristic before irradiation with light [UNIRRADIATED (REFERENCE)] is shown together.

As shown in FIG. 14, the characteristic of the thin film transistors beneath the resist pattern cured by applying the fourth embodiment using the light source (extra-high pressure mercury lamp) not generating the light having a wavelength of shorter than 260 nm was confirmed to be retaining the characteristic before irradiation with light [UNIRRADIATED (REFERENCE)] and be free of degradation.

Fifth Embodiment

A fifth embodiment differs from the first embodiment in that a light shielding film is provided on the upper side of channel parts, whereby irradiation of the channel parts with light having a wavelength of shorter than 260 nm is prevented by the light shielding film, at the time of performing irradiation of the resist pattern with light as a preliminary step for a heat curing treatment. Now, a manufacturing method according to the fifth embodiment will be described below.

Figure 15A:
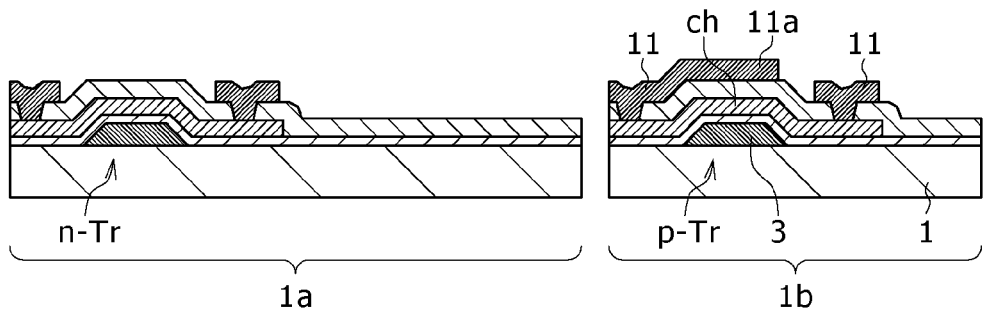
FIGS. 15A to 15C are sectional step views for illustrating a manufacturing method according to a fifth embodiment.

First, as shown in FIG. 15A, bottom gate type thin film transistors Tr are formed on a first substrate 1 made of a transparent material such as a glass. In this case, like in the first embodiment, for example, n-type thin film transistors n-Tr are formed in a display region 1a, each correspondingly to each pixel, whereas n-type thin film transistors n-Tr and p-type thin film transistors p-Tr are formed in a peripheral region 1b.

Next, the upper side of the first substrate 1 provided with the thin film transistors Tr is covered with an inter-layer insulating film 9, and wirings 11 connected to the thin film transistors Tr through contact holes formed in the inter-layer insulating film 9 are formed. As a result, pixel circuits 13 using the thin film transistors Tr are formed, one for each pixel in the display region 1a. Besides, in the peripheral region 1b, driving circuits 15 of a CMOS configuration using the n-type thin film transistor n-Tr and the p-type thin film transistor p-Tr are formed.

In this case, particularly in the fifth embodiment, a light shielding film 11a is formed on the inter-layer insulating film 9 in the state of covering at least the channel parts ch of the p-type thin film transistors p-Tr. The light shielding film 11a is formed from, for example, aluminum (Al), titanium (Ti), tungsten (W), silver (Ag), or an alloy thereof. Further, the light shielding film 11a may be composed of the same layer as that of the wirings 11, and may be extended from the wirings 11 as shown in the drawing. Besides, the light shielding film 11a may be formed in a shape independent from the wirings 11.

In the above-mentioned manner, a so-called TFT substrate 20 is formed.

Figure 15B:
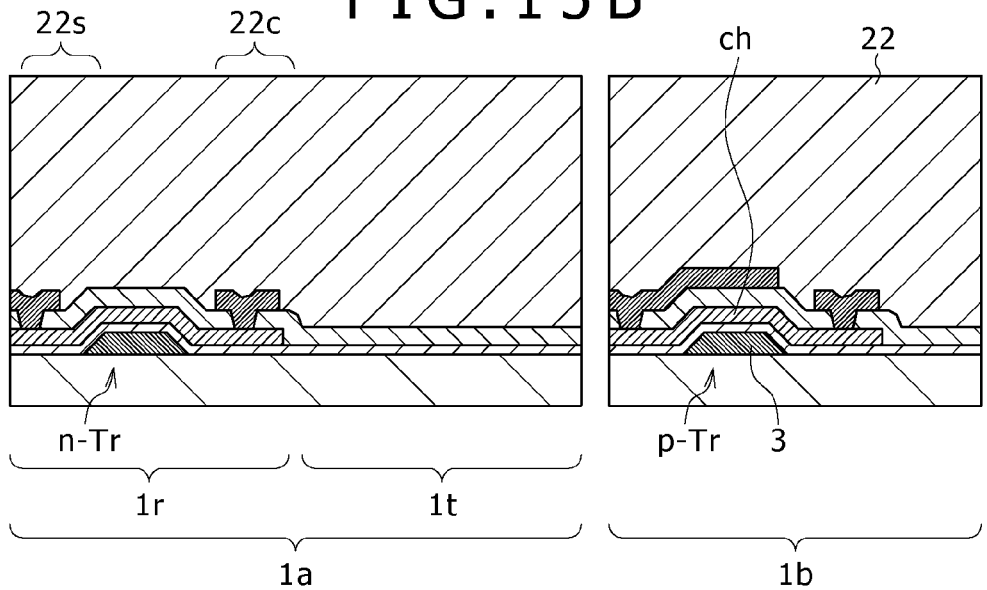

Thereafter, like in the first embodiment, as shown in FIG. 15B, an uncured resist film 22 is formed on the TFT substrate 20 by application (coating), and the resist film 22 is subjected to multi-step exposure. In this case, like in the first embodiment, exposure may be conducted by use of a stepper having an extra-high pressure mercury lamp as a light source, and light having a wavelength of shorter than 260 nm may be contained in the exposure light.

Figure 15C:
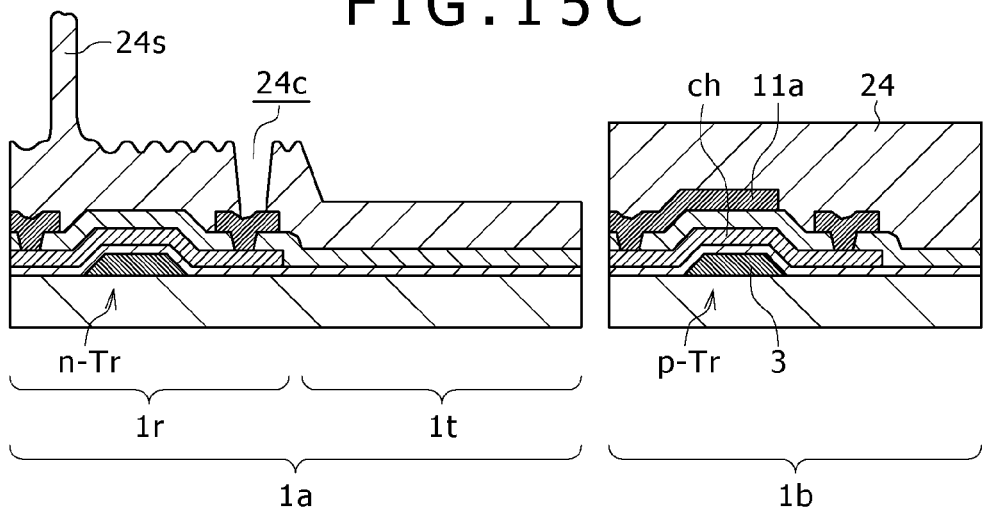

Thereafter, the resist film 22 is subjected to a developing treatment, whereby patterning is achieved through dissolution of the exposed portions thereof into a developing solution. Consequently, as shown in FIG. 15C, a resist pattern 24 patterned into a desired shape is obtained, like in the first embodiment.

The next and subsequent steps constitute a process of curing the resist pattern 24. Now, the curing process will be described below referring to a flowchart in FIG. 16. In this fifth embodiment, step S2-5 is a prime, whereas steps S1 and S3 may be the same as in the first embodiment, so that description thereof is omitted here.

First, in step S1, the substrate provided with the resist pattern is subjected to a drying treatment. Thereafter, in step S2-5, the resist pattern having undergone the drying treatment is irradiated with light containing ultraviolet light in an atmosphere filled with a dry gas. In this case, like in the first embodiment, the irradiation is conducted in the condition where the channel parts of the thin film transistors are prevented from being irradiated with light having a wavelength of shorter than 260 nm. In the fifth embodiment, the shielding of the light having a wavelength of shorter than 260 nm is performed by use of the light shielding film, whereas the other configurations are the same as those in step S2-1 of the first embodiment.

Specifically, as the dry gas, an inert gas is used in the same manner as in the first embodiment.

Besides, as the light containing ultraviolet light with which to irradiate the resist pattern, like in the first embodiment, visible light for enhancing the light transmittance of the heat-cured resist pattern is preferably used together with ultraviolet light, which is used for performing the subsequent heat curing of the resist pattern with good shape accuracy. Therefore, as the light source for irradiation with light, a light source which has bright lines in the ultraviolet and visible ranges and which is suited to irradiation of a wide area with light is used. Examples of the light source for use here include a high pressure mercury lamp (bright lines: 254 nm/365 nm/405 nm/436 nm/546 nm/577 nm/579 nm) and a low pressure mercury lamp (bright lines: 185 nm/254 nm/436 nm/550 nm).

Thus, the resist pattern is irradiated with light containing visible light together with ultraviolet light, whereby particularly by the light shielding film provided in the peripheral region, the channel parts of the p-type thin film transistors p-Tr are prevented from being irradiated with light having a wavelength of shorter than 260 nm.

Incidentally, like in the first embodiment, the step of irradiating with light containing ultraviolet light may be carried out under a heating condition. Besides, the treating conditions in the step of irradiating with the light containing ultraviolet light become parameters for controlling the ruggedness of the surface shape of the resist pattern after heat curing, in the same manner as above. Therefore, like in the first embodiment, it is preferable to preliminarily detect the treating conditions such as to bring the ruggedness of the surface shape of the heat-cured resist pattern into a predetermined state, for example, by conducting a preliminary experiment, and to perform the irradiation with the light containing ultraviolet light under the treating conditions thus detected.

Thereafter, in step S3, a heat curing treatment of the resist pattern is conducted, in the same manner as in the first embodiment.

Further, after the above, a liquid crystal layer LC is sandwiched between two substrates 1 and 30, in the same manner as described referring to FIG. 3 in the first embodiment above. As a result, a liquid crystal display device 36' shown in FIG. 17 is obtained. The liquid crystal display device 36' differs from the liquid crystal display device of FIG. 3 in that the upper side of the channel parts ch of the p-type thin film transistors p-Tr provided in the peripheral region 1b is covered with the light shielding film 11a, the other configurations being the same as in FIG. 3.

In this liquid crystal display device 36', the resist pattern 24' covering the upper side of the first substrate 1 is formed as an integral structure which buries the ruggedness on the upper side of the first substrate 1 and which is provided with a plurality of recessed and projected shapes at its surface.

According to the fifth embodiment as above, as has been described referring to FIGS. 15A to 15C and 16, the step of irradiating with the light containing ultraviolet light in an atmosphere filled with a dry gas (step S2-5) is conducted before the step of heat curing the resist pattern obtained by patterning through exposure and development (step S3). This ensures that reflow of the resist material at the time of heat curing in step S3 is prevented from occurring, and the surface shape of the resist pattern is maintained in the shape obtained by patterning through exposure and development.

Accordingly, like in the first embodiment, the resist pattern formed in an enlarged film thickness can be heat cured in the state of retaining the rugged surface shape.

Besides, particularly in the step of irradiating with the light containing ultraviolet light (step S2-5), as shown in FIG. 15C, irradiation with the light h containing ultraviolet light is conducted from the upper side of the light shielding film 11a provided on the channel parts ch of the bottom gate type p-type thin film transistors p-Tr, whereby the channel parts ch of the p-type thin film transistors p-Tr are prevented from being irradiated with light having a wavelength of shorter than 260 nm. This ensures that degradation of characteristics of the p-type thin film transistors p-Tr due to irradiation of the channel parts ch with short-wavelength light can be prevented from occurring.

Consequently, by the method according to the fifth embodiment, it is possible to obtain a liquid crystal display device 36' having the resist pattern 24' with good heat resistance which is securely cured in the state of retaining its shape immediately upon lithography, without any degradation of characteristics of the thin film transistors Tr covered with the resist pattern 24'.

Figure 18:
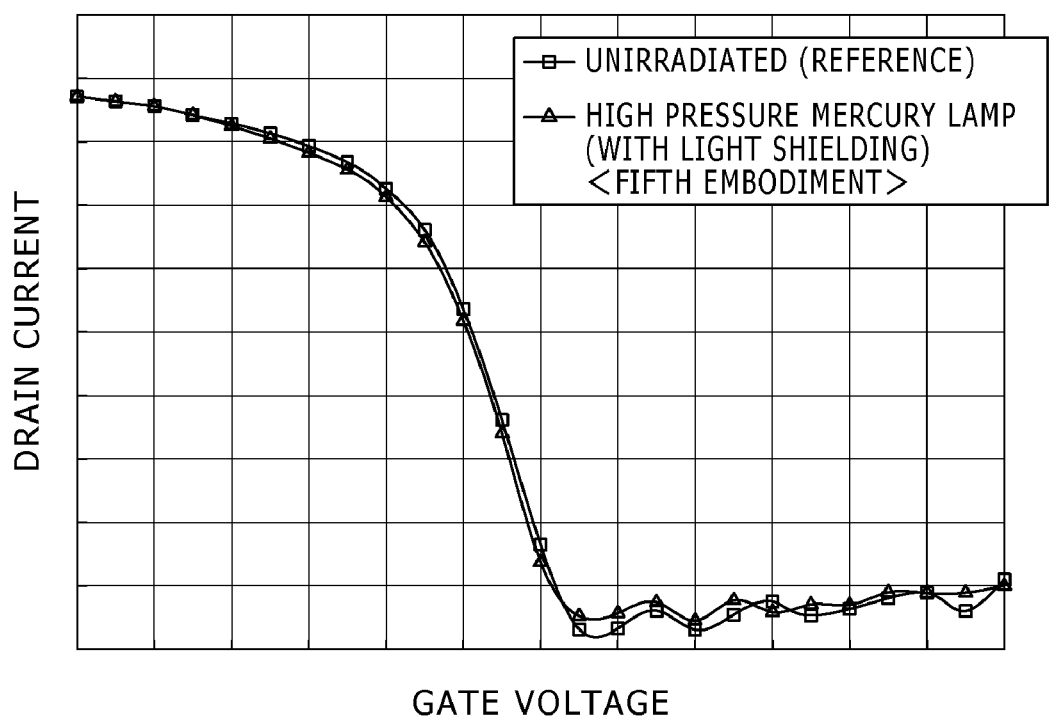
FIG. 18 is a diagram showing the transistor characteristics of a thin film transistor beneath a resist pattern cured by applying the method according to the fifth embodiment, together with a reference.

Here, FIG. 18 shows transistor characteristics of the thin film transistors beneath the resist pattern cured by applying the method according to the fifth embodiment [IRRADIATED WITH LIGHT FROM HIGH PRESSURE MERCURY LAMP (WITH LIGHT SHIELD)]. In this case, in step S2-5, the resist pattern was irradiated with light from a high pressure mercury lamp containing light having a wavelength of shorter than 260 nm in an energy of 200 mJ, and thereafter the heat curing treatment in step S3 was conducted. Besides, transistor characteristics before irradiation with light [UNIRRADIATED (REFERENCE)] is shown together.

As shown in FIG. 18, the characteristics of the thin film transistor beneath the resist pattern having undergone a curing treatment inclusive of irradiation with light in the condition where a light shielding film was provided on the channel parts by applying the fifth embodiment were confirmed to be maintained at the characteristics before irradiation with light [UNIRRADIATED (REFERENCE)] and be free of degradation.

<Circuit Configuration of Display>

Figure 19:
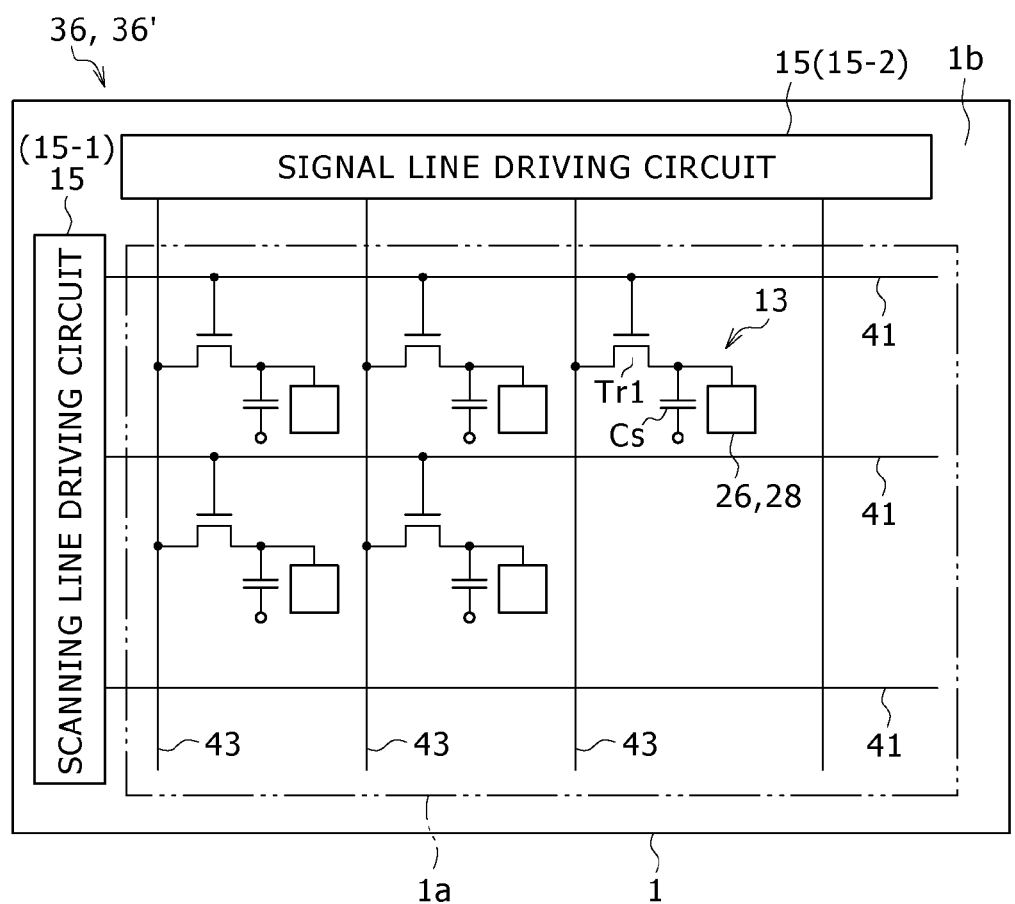
FIG. 19 is a diagram showing an example of the circuit configuration of a liquid crystal display device according to an embodiment.

FIG. 19 is a diagram showing an example of circuit configuration of the active matrix type liquid crystal display devices 36, 36' shown in the embodiments above. As shown in the diagram, the display region 1a and the peripheral region 1b are set on the first substrate 1 in the liquid crystal display devices 36, 36'. The display region 1a is configured as a pixel array part in which a plurality of scanning lines 41 and a plurality of signal lines 43 are arranged longitudinally and transversely, and one pixel is provided correspondingly to each of intersections of the lines. In addition, in the peripheral region 1b, a scanning line driving circuit 15 (15-1) for scanningly driving the scanning lines 41 and a signal line driving circuit 15 (15-2) for supplying a video signal according to luminance information (namely, an input signal) to the signal lines 43 are arranged.

The pixel circuit 13 provided for each of pixels corresponding to the scanning lines 41 and the plurality of signal lines 43 includes the above-described pixel electrode composed of the transparent electrode 26 and the reflecting electrode 28, the thin film transistor Tr, and a holding capacitance Cs. By driving by the scanning line driving circuit 15-1, the video signal written from the signal line 47 through the thin film transistor Tr is held in the holding capacitance Cs, a voltage according to the amount of the signal held is supplied to the pixel electrode 26, 28, and the liquid crystal molecules constituting the liquid crystal layer are inclined according to the voltage, whereby passage of the display light is controlled.

Incidentally, the configuration of the pixel circuit 13 as just-mentioned is merely an example, so that, if occasion demands, a capacitance element may be provided in the pixel circuit 13, or a plurality of transistors may further be provided to constitute the pixel circuit 13. Besides, to the peripheral region 1b, a requisite driving circuit 15 is added according to a change in the pixel circuit 13.

<Application Example>

The display according to embodiments of the present invention as above-described is applicable to displays of electronic apparatuses in all fields, by which a video signal inputted to the electronic apparatus or a video signal produced in the electronic apparatus is displayed as an image or picture, such as the electronic apparatuses shown in FIGS. 20 to 24G, for example, digital cameras, notebook size personal computers, PDA such as mobile phones, video cameras, etc. Now, examples of the electronic apparatus to which the present invention is applied will be described below.

Figure 20:
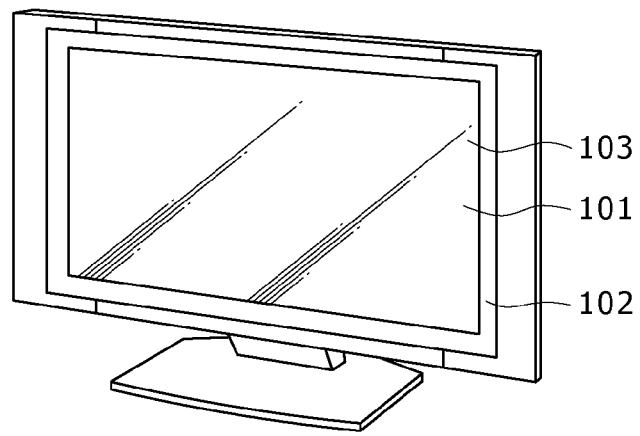
FIG. 20 is a perspective view of a TV set to which the present invention is applied.

FIG. 20 is a perspective view showing a TV set to which the present invention is applied. The TV set pertaining to this application example include a video display screen unit 101 composed of a front panel 102, a filter glass 103 and the like, and is produced by using a display according to an embodiment of the present invention as the video display screen unit 101.

Figure 21A:
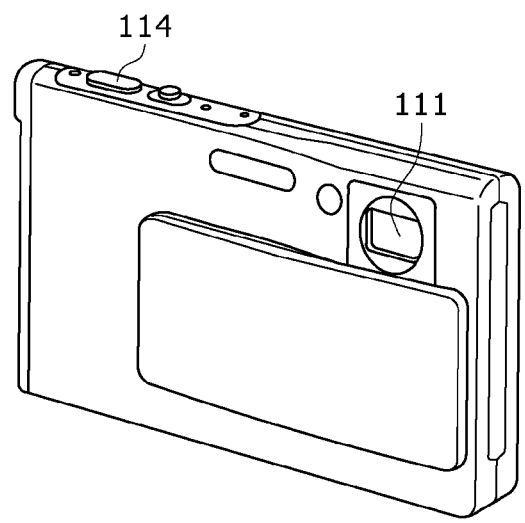
Figure 21B:
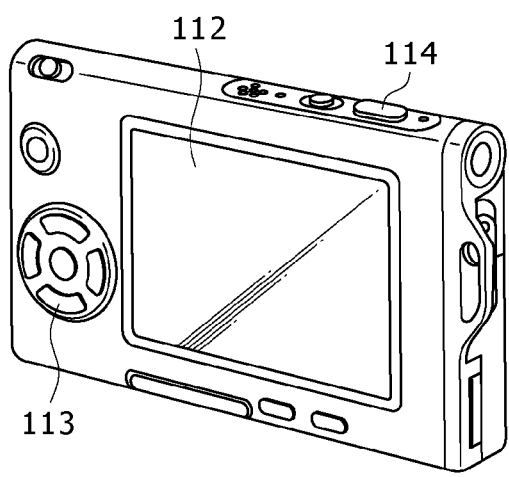

FIGS. 21A and 21B are perspective views showing a digital camera to which the present invention is applied, wherein FIG. 21A is a perspective view from the face side, and FIG. 21B is a perspective view from the back side. The digital camera pertaining to this application example includes a flash light emitting part 111, a display part 112, a menu switch 113, a shutter button 114, and so on, and is produced by using a display according to an embodiment of the present invention as the display part 112.

Figure 22:
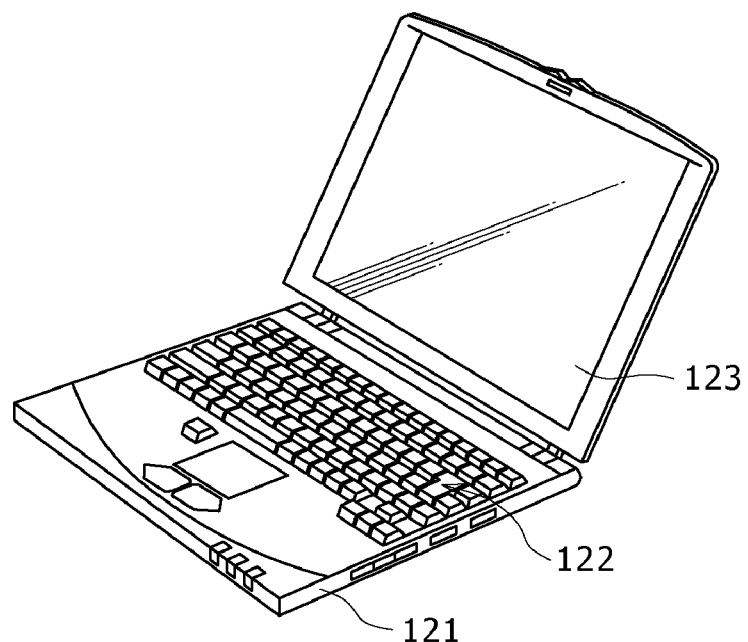
FIG. 22 is a perspective view of a notebook size personal computer to which the present invention is applied.

FIG. 22 is a perspective view showing a notebook size personal computer to which the present invention is applied. The notebook size personal computer pertaining to this application example includes a main body 121, a keyboard 122 operated at the time of inputting characters and the like, a display part 123 for displaying an image, and so on, and is produced by using a display according to an embodiment of the present invention as the display part 123.

Figure 23:
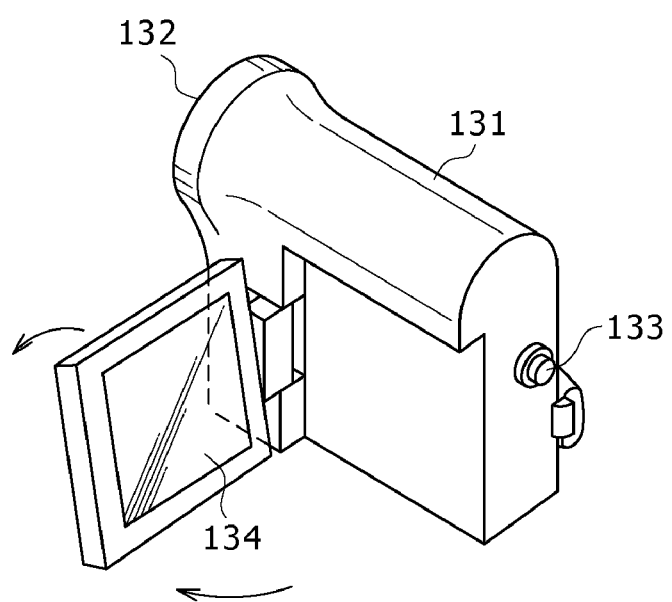
FIG. 23 is a perspective view of a video camera to which the present invention is applied.
Figure 25:
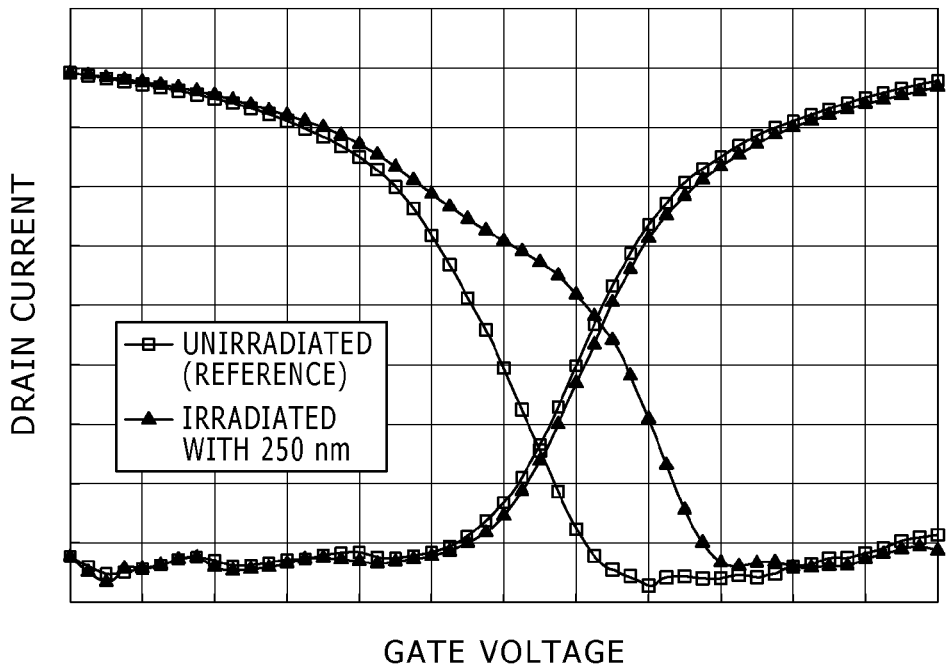
FIG. 25 is a diagram showing degradation of characteristics of a p-channel type thin film transistor by irradiation with ultraviolet light.
Figure 26:
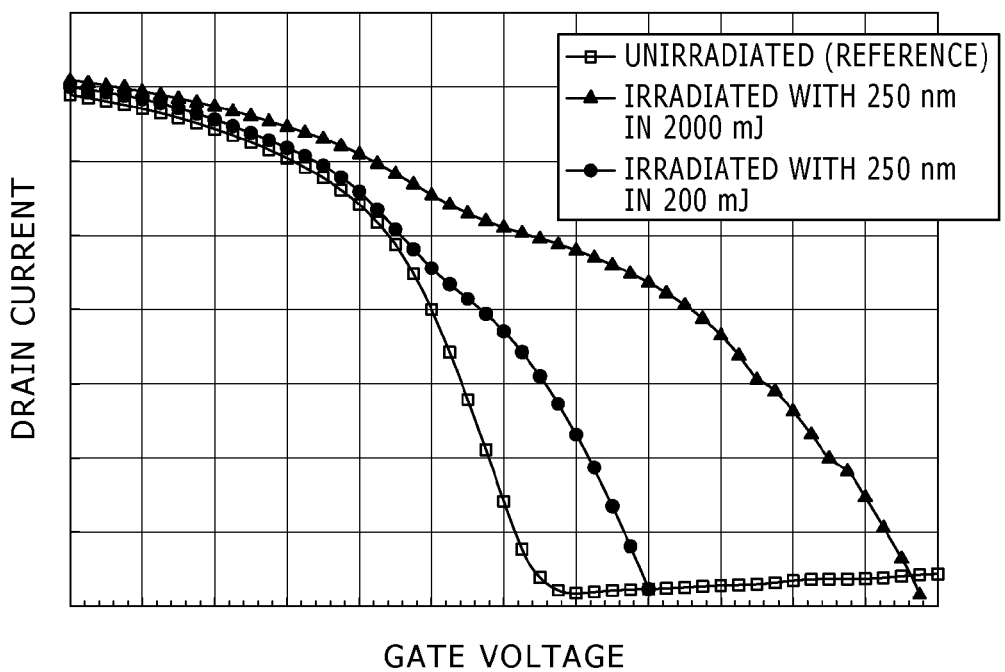
FIG. 26 is a diagram showing degradation of characteristics of a thin film transistor on the basis of irradiation energy of ultraviolet light.

FIG. 23 is a perspective view showing a video camera to which the present invention is applied. The video camera pertaining to this application example includes a main body part 131, an object shooting lens 132 provided at a side surface directed forwards, a start/stop switch 133 operated at the time of shooting, a display part 134, and so on, and is produced by using a display according to an embodiment of the present invention as the display part 134.

FIGS. 24A to 24G show a PDA, for example, a mobile phone to which the present invention is applied, wherein FIG. 24A is a front view of an opened state, FIG. 24B is a side view of the same, FIG. 24C is a front view of a closed state, FIG. 24D is a left side view, FIG. 24E is a right side view, FIG. 24F is a top view, and FIG. 24G is a bottom view. The mobile phone pertaining to this application example includes an upper-side casing 141, a lower-side casing 142, a joint part (here, a hinge part) 143, a display 144, a sub-display 145, a picture light 146, a camera 147, and so on, and is produced by using a display according to an embodiment of the present invention as the display 144 and/or the sub-display 145.

Incidentally, while configurations in which the present invention is applied to a liquid crystal display device have been described in the embodiments above, the present invention is applicable also to a display configured by arranging organic electroluminescence elements (so-called organic EL display). In this case, the resist film described in the above embodiments is applied as an insulating film covering a display region where the organic electroluminescence elements are provided.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing an electronic apparatus having a resist pattern provided over a substrate provided with a thin film transistor, said method comprising:
   forming by application a resist film over said substrate in a state of covering said thin film transistor;
   forming a resist pattern by subjecting said resist film to exposure to light and a developing treatment; and
   irradiating said resist pattern with at least one of ultraviolet light and visible light in a dry atmosphere in a condition where a channel part of said thin film transistor is prevented from being irradiated with light having a wavelength shorter than 260 nm,
   wherein,
      a step of heat curing said resist pattern is conducted after said irradiation with the at least one of ultraviolet light and visible light.

2. The method of manufacturing an electronic apparatus as set forth in claim 1, wherein a step of subjecting said substrate provided with said resist pattern to a drying treatment is conducted between said step of forming said resist pattern and said step of irradiating with at least one of ultraviolet light and visible light.

3. The method of manufacturing an electronic apparatus as set forth in claim 1, wherein said step of irradiating with at least one of ultraviolet light and visible light is conducted under a heating condition.

4. The method of manufacturing an electronic apparatus as set forth in claim 1, wherein said step of irradiating with at least one of ultraviolet light and visible light is conducted using an atmosphere filled with a dry gas as said dry atmosphere.

5. The method of manufacturing an electronic apparatus as set forth in claim 1, wherein in said step of irradiating said resist pattern with at least one of ultraviolet light and visible light, irradiation of said resist pattern with light is conducted through an optical filter operative to shield light having a wavelength of shorter than 260 nm, whereby said channel part is prevented from being irradiated with light having a wavelength of shorter than 260 nm.

6. The method of manufacturing an electronic apparatus as set forth in claim 1, wherein
   said thin film transistor is of a bottom gate type; and
   in said step of irradiating said resist pattern with at least one of ultraviolet light and visible light, light having a wavelength of shorter than 260 nm is absorbed into said resist pattern, whereby said channel part is prevented from being irradiated with light having a wavelength of shorter than 260 nm.

7. The method of manufacturing an electronic apparatus as set forth in claim 1, wherein said thin film transistor is of a bottom gate type; and in said step of irradiating said resist pattern with at least one of ultraviolet light and visible light, irradiation with light from the substrate side is conducted, whereby a gate electrode of said thin film transistor is used as a light shielding film for said channel part.

8. The method of manufacturing an electronic apparatus as set forth in claim 1, wherein in said step of irradiating said resist pattern with at least one of ultraviolet light and visible light, a light source operative to generate only light having a wavelength of not less than 260 nm is used as a light source.

9. The method of manufacturing an electronic apparatus as set forth in claim 1, wherein said thin film transistor is of a bottom gate type;

a light shielding film for light having a wavelength of shorter than 260 nm is formed over said channel part of said thin film transistor before said step of forming said resist film by application; and in said step of irradiating said resist pattern with at least one of ultraviolet light and visible light, said channel part is prevented by said light shielding film from being irradiated with light having a wavelength shorter than 260 nm.

10. The method of manufacturing an electronic apparatus as set forth in claim 1, wherein said resist pattern is configured using a positive-type resist material.

11. The method of manufacturing an electronic apparatus as set forth in claim 1, wherein in said step of irradiating said resist pattern with at least one of ultraviolet light and visible light, said resist pattern is irradiated with visible light together with ultraviolet light.

12. The method of manufacturing an electronic apparatus as set forth in claim 1, wherein after said step of heat curing said resist pattern, a pixel electrode is formed over said resist pattern, so as to manufacture said electronic apparatus as a display device.

13. The method of manufacturing an electronic apparatus as set forth in claim 1, wherein a p-channel type thin film transistor is formed as said thin film transistor.

* * * * *